(12) United States Patent
Iwai et al.

(10) Patent No.: US 9,818,771 B2
(45) Date of Patent: Nov. 14, 2017

(54) DISPLAY DEVICE

(71) Applicant: Japan Display Inc., Tokyo (JP)

(72) Inventors: Yohei Iwai, Tokyo (JP); Ryosuke Imaseki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/412,740

(22) Filed: Jan. 23, 2017

(65) Prior Publication Data
US 2017/0221934 A1 Aug. 3, 2017

(30) Foreign Application Priority Data
Feb. 2, 2016 (JP) .................. 2016-017746

(51) Int. Cl.
| | | |
|---|---|---|
| *H01L 27/12* | (2006.01) | |
| *H01L 23/00* | (2006.01) | |
| *G02F 1/1368* | (2006.01) | |
| *G02F 1/1345* | (2006.01) | |

(52) U.S. Cl.
CPC .......... *H01L 27/1244* (2013.01); *H01L 24/14* (2013.01); *H01L 24/81* (2013.01); *G02F 1/1368* (2013.01); *G02F 1/13452* (2013.01); *G02F 1/13458* (2013.01); *H01L 2224/1403* (2013.01); *H01L 2224/14135* (2013.01); *H01L 2224/14165* (2013.01); *H01L 2224/14177* (2013.01); *H01L 2224/16145* (2013.01); *H01L 2224/17517* (2013.01); *H01L 2224/81194* (2013.01); *H01L 2224/81203* (2013.01); *H01L 2924/10155* (2013.01); *H01L 2924/10156* (2013.01); *H01L 2924/1426* (2013.01)

(58) Field of Classification Search
CPC ......... H01L 24/10; H01L 24/14; H01L 24/19; H01L 24/81; H01L 27/1244
See application file for complete search history.

(56) References Cited

U.S. PATENT DOCUMENTS

| | | | |
|---|---|---|---|
| 6,885,426 B2 * | 4/2005 | Matsui | H01L 24/29 257/E21.514 |
| 9,716,115 B2 * | 7/2017 | Her | H01L 27/1244 |
| 2002/0158324 A1* | 10/2002 | Hamaguchi | H01L 27/14609 257/686 |
| 2014/0029226 A1 | 1/2014 | Abe et al. | |
| 2015/0061723 A1 | 3/2015 | Zhang et al. | |

FOREIGN PATENT DOCUMENTS

| | | |
|---|---|---|
| JP | 2014-26042 A | 2/2014 |
| JP | 2015-49435 A | 3/2015 |
| JP | 2015-122366 A | 7/2015 |

* cited by examiner

*Primary Examiner* — Cuong Q Nguyen
(74) *Attorney, Agent, or Firm* — Typha IP LLC

(57) ABSTRACT

A display device made of a TFT substrate and a driver IC is configured to eliminate bad connection between them. On the driver IC connected to the TFT substrate, a first principal surface has first bumps formed along a first side having a first edge and second bumps formed along a second side opposite to the first side and having a second edge. The TFT substrate has first terminals and second terminals connected to the first and the second bumps, respectively. On a cross section taken perpendicularly to the first and the second sides, the first principal surface has a first area between the first and the second bumps and a second area between the second bumps and the second edge. The first and the second areas are bent toward the TFT substrate.

14 Claims, 32 Drawing Sheets

FIG. 25

| CONTROL FACTORS | LEVEL 1 | LEVEL 2 | LEVEL 3 |
|---|---|---|---|
| DENSITY OF CONDUCTIVE PARTICLES | 15/BUMP | 30/BUMP | — |
| HARDNESS OF CONDUCTIVE PARTICLES | SOFT | SLIGHTLY HARD | EXTREMELY HARD |
| PRESENCE OF DUMMY BUMPS | NONE | SINGLE ROW | TWO ROWS |
| IC THICKNESS | 100 $\mu$m | 200 $\mu$m | 300 $\mu$m |
| THICKNESS OF RESIN SHEET | 30 $\mu$m | 50 $\mu$m | 100 $\mu$m |
| WIDTH OF EAVES | 20 $\mu$m | 50 $\mu$m | 80 $\mu$m |
| SPACING BETWEEN INPUT BUMPS AND OUTPUT BUMPS | 400 $\mu$m | 800 $\mu$m | 1200 $\mu$m |
| AREA RATIO OF INPUT BUMPS TO OUTPUT BUMPS | 1:1 | 1:2 | 1:3 |

STANDARD CONDITION (LEVEL 2)

(TABLE 1)

| IC THICKNESS | A < 700 μm | A ≥ 700 μm |
|---|---|---|
| WHERE t IS 100 μm | A x 0.215 μm OR MORE | A x 0.155 μm OR MORE |
| WHERE t IS 150 μm | A x 0.165 μm OR MORE | A x 0.150 μm OR MORE |
| WHERE t IS 170 μm | A x 0.150 μm OR MORE | A x 0.145 μm OR MORE |
| WHERE t IS 200 μm | A x 0.130 μm OR MORE | A x 0.140 μm OR MORE |
| WHERE t IS 300 μm | A x 0.080 μm OR MORE | A x 0.125 μm OR MORE |

(TABLE 2)

| IC THICKNESS | WIDTH OF EAVES (μm) | REMARKS |
|---|---|---|
| WHERE t IS 100 μm | 0.1492 x A−3.6061 OR LESS | PROVIDED A x 50 μm |
| WHERE t IS 150 μm | 0.1497 x A−18.509 OR LESS | PROVIDED A x 150 μm |
| WHERE t IS 170 μm | 0.1495 x A−24.299 OR LESS | PROVIDED A x 200 μm |
| WHERE t IS 200 μm | 0.1496 x A−32.906 OR LESS | PROVIDED A x 300 μm |
| WHERE t IS 300 μm | 0.1502 x A−61.941 OR LESS | PROVIDED A x 450 μm |

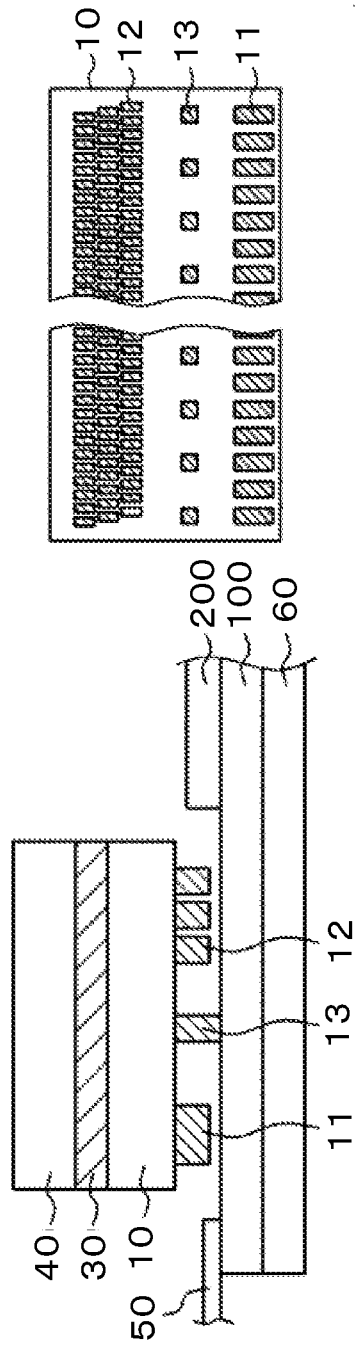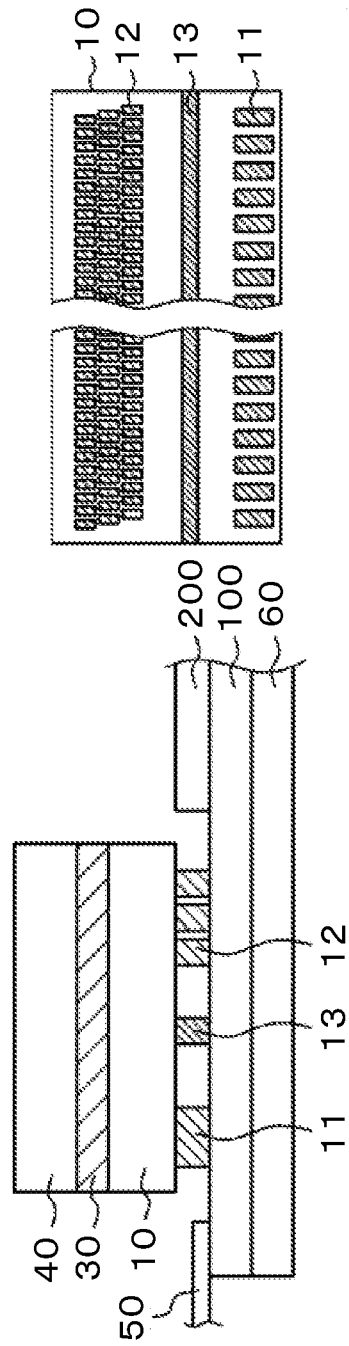

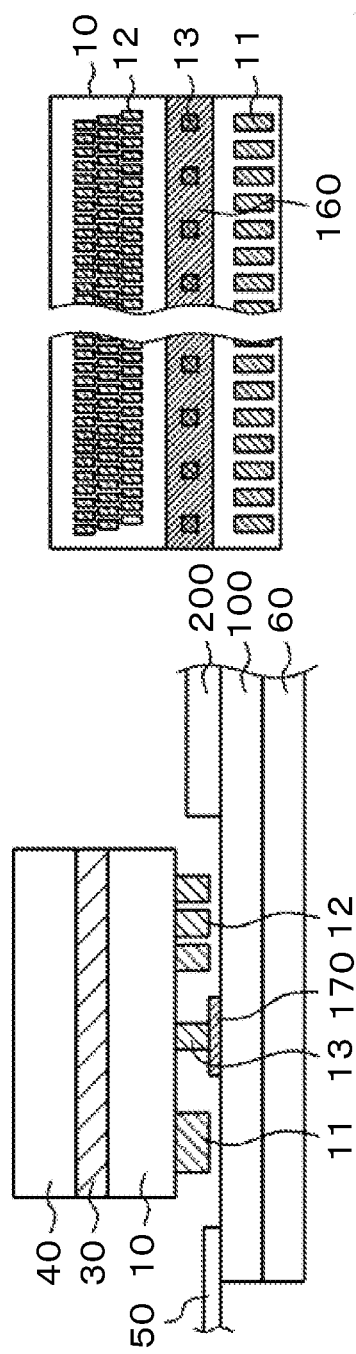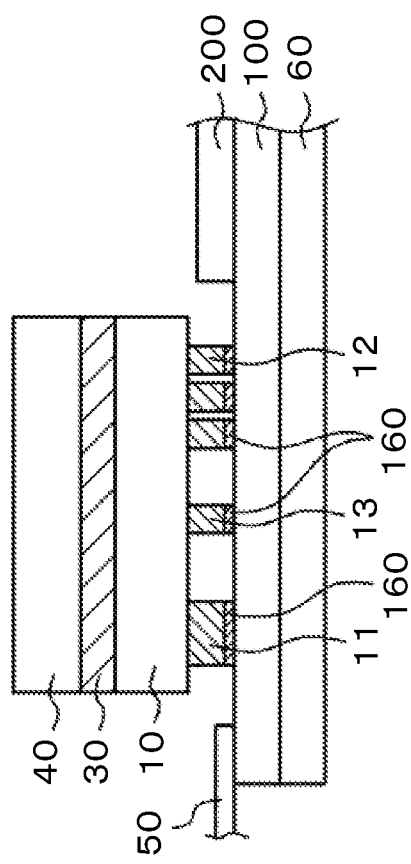

FIG. 38
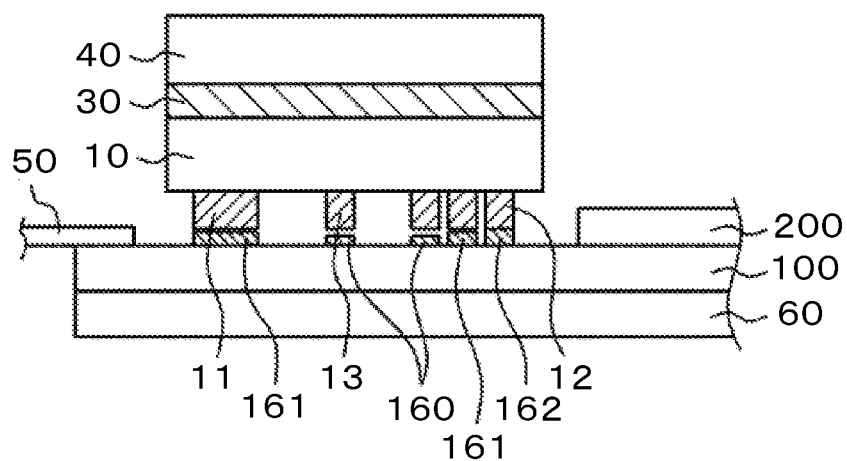
FIG. 39
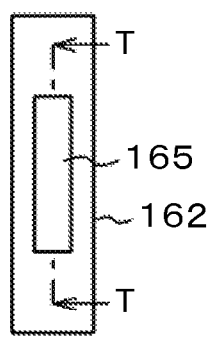
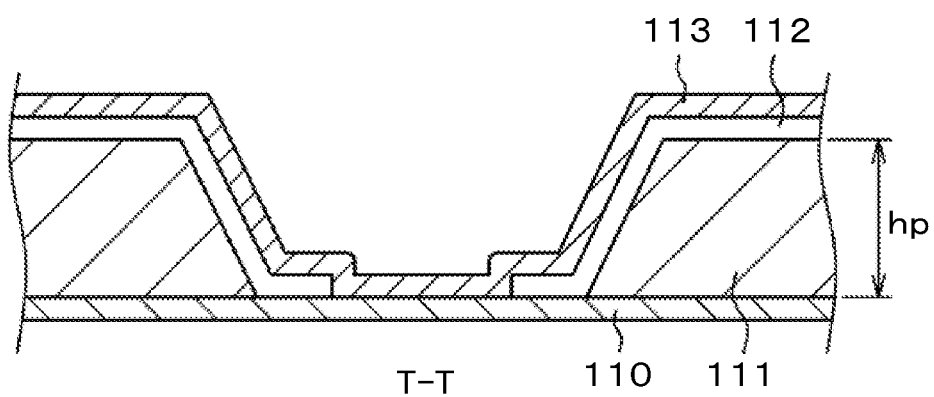

DISPLAY DEVICE

CLAIM OF PRIORITY

The present application claims priority from Japanese Patent Application JP 2016-017746 filed on Feb. 2, 2016, the content of which is hereby incorporated by reference into this application.

BACKGROUND OF THE INVENTION

1. Field of the Invention

The present invention relates to techniques for improving the reliability of the connection between a display device and a driver integrated circuit (IC) mounted thereon.

2. Description of the Related Art

Thin, flat display devices such as liquid crystal display devices and organic electroluminescent (EL) display devices have come to be equipped with higher resolution screens entailing large numbers of connection terminals for driver ICs. Although this specification describes the present invention using a liquid crystal display device as an example, the invention also applies to other display devices including organic EL display devices.

Of the display devices, liquid crystal display devices are each constituted by a thin-film transistor (TFT) substrate having pixel electrodes and TFTs formed thereon in matrix and by a counter substrate disposed opposite to the TFT substrate. The TFT substrate and the counter substrate have liquid crystal sandwiched therebetween. The light transmittance of liquid crystal molecules is controlled per pixel to form images.

The pixels are each fed with a scanning signal via a scanning line and a video signal via a video line. A driver IC is used to generate scanning signals and video signals. The driver IC is connected to the terminal area of the TFT substrate with an anisotropic conductive film (ACF) interposed between bumps of the driver IC and terminals in the terminal area.

The ACF is a thermoplastic film with conductive particles sprinkled thereon. A heated pressure bonding head is used to thermally pressure-bond the driver IC to the terminals with the ACF interposed therebetween. After thermal pressure bonding, the conductive particles of the film ensure conductive connection between the bumps of the driver IC and the terminals.

The driver IC has multiple bumps. Every one of these bumps needs to be securely connected to each of the corresponding multiple terminals. JP-A-2015-49435 describes an inspection system for detecting whether the driver IC is securely connected to the terminals.

Meanwhile, when the driver IC is connected by thermal pressure bonding, the driver IC tends to be bent thereby. A bent driver IC fails to pressure the bumps uniformly. JP-A-2014-26042 describes a configuration which, to counter such a phenomenon, has dummy bumps disposed between input and output bumps.

JP-A-2015-122366 describes a configuration involving a driver IC that has multiple rows of terminals formed on one side and a single row of terminals on the opposite side. When the driver IC is thermally pressure-bonded, the pressure bonding force on the terminals of the multiple-row side tends to diminish, leading to bad connection. This problem is circumvented by making the distance between the terminals and the driver IC edge longer on the multiple-row side than on the single-row side so that each terminal is given uniform pressure bonding force.

SUMMARY OF THE INVENTION

Liquid crystal display devices have come to possess higher resolution screens than ever before, with growing numbers of bumps formed on the driver IC matched by the corresponding terminals. That has led to diminishing areas for the bumps or for the terminals. Under these circumstances, the driver IC and the terminals need to be connected in a highly reliable manner.

The driver IC has a rectangular plane having the long and the short sides. The bumps for input to the IC are linearly disposed on a first long side, and the bumps for output from the IC are linearly disposed on a second long side opposite to the first long side. When a thermally pressure-bonded driver IC is bent in the direction of the short sides, it leaves the outermost bumps insufficiently pressured, resulting in bad connection.

It is therefore an object of the present invention to overcome the above and other problems of the related art and to provide a highly reliable liquid crystal display device that has secure connection between its driver IC and terminals. Such problems exist not only with liquid crystal display devices but also with other display devices including organic EL display devices that use the driver IC.

The present invention proposes overcoming the above problems using the typical means outlined below. A display device made of a TFT substrate and a driver IC is provided. On the driver IC connected to the TFT substrate, a first principal surface has first bumps formed along a first side having a first edge and second bumps formed along a second side opposite to the first side and having a second edge. The TFT substrate has first terminals and second terminals connected to the first and the second bumps, respectively. On a cross section taken perpendicularly to the first and the second sides, the first principal surface has a first area between the first and the second bumps and a second area between the second bumps and the second edge. The first and the second areas are bent toward the TFT substrate.

BRIEF DESCRIPTION OF THE DRAWINGS

FIG. 25 is a tabular view listing control factors in quality engineering relative to different levels;

FIG. 34 is a cross-sectional view showing a first mode of a second embodiment of the present invention;

FIG. 35 is a cross-sectional view showing a second mode of the second embodiment;

FIG. 36 is a cross-sectional view showing a third mode of the second embodiment;

FIG. 37 is a cross-sectional view showing how bumps of the driver IC are connected to terminals of the TFT substrate;

FIG. 38 is a cross-sectional view showing how bumps of the driver IC are connected to terminals of the TFT substrate in a third embodiment of the present invention;

FIG. 39 is a schematic view showing a typical structure of a protruding terminal.

DESCRIPTION OF THE PREFERRED EMBODIMENTS

The present invention is described below in detail using some preferred embodiments.

First Embodiment

Figure 1:
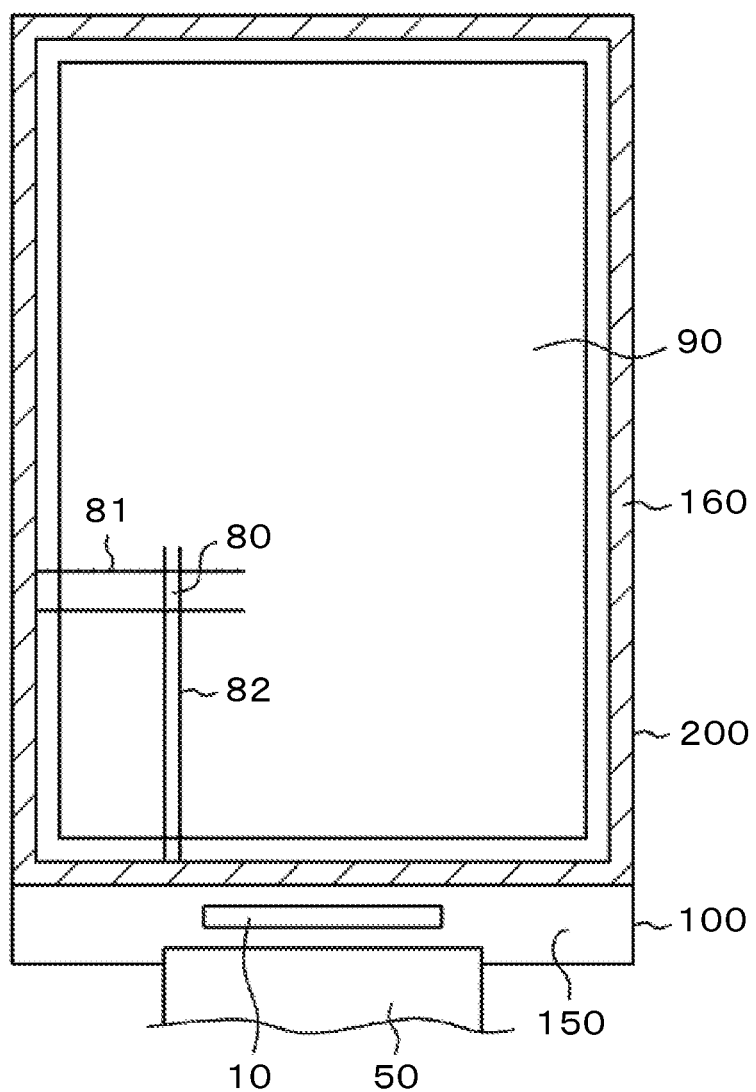
FIG. 1 is a plan view of a liquid crystal display device to which the present invention is applied.

FIG. 1 is a plan view showing a typical liquid crystal display device to which the present invention is applied. In FIG. 1, a TFT substrate 100 and a counter substrate 200 are bonded together with a seal material interposed peripherally therebetween. Liquid crystal is sandwiched between the TFT substrate 100 and the counter substrate 200. A display area 90 is formed in a portion where the TFT substrate 100 and the counter substrate 200 are disposed opposite to each other. The display area 90 has scanning lines 81 extending in a first direction and arrayed in a second direction, and has video lines 82 extending in the second direction and arrayed in the first direction. The regions enclosed by the scanning lines 81 and video lines 82 each constitute a pixel 80.

The TFT substrate 100 is formed to be larger than the counter substrate 200. That portion of the TFT substrate 100 which is not covered by the counter substrate 200 constitutes a terminal area 150. The terminal area 150 is connected to a driver IC 10 that supplies scanning signals or video signals. The terminal area 150 is also connected to a flexible wiring substrate 50 through which video signals and power are supplied from the outside.

Figure 2:
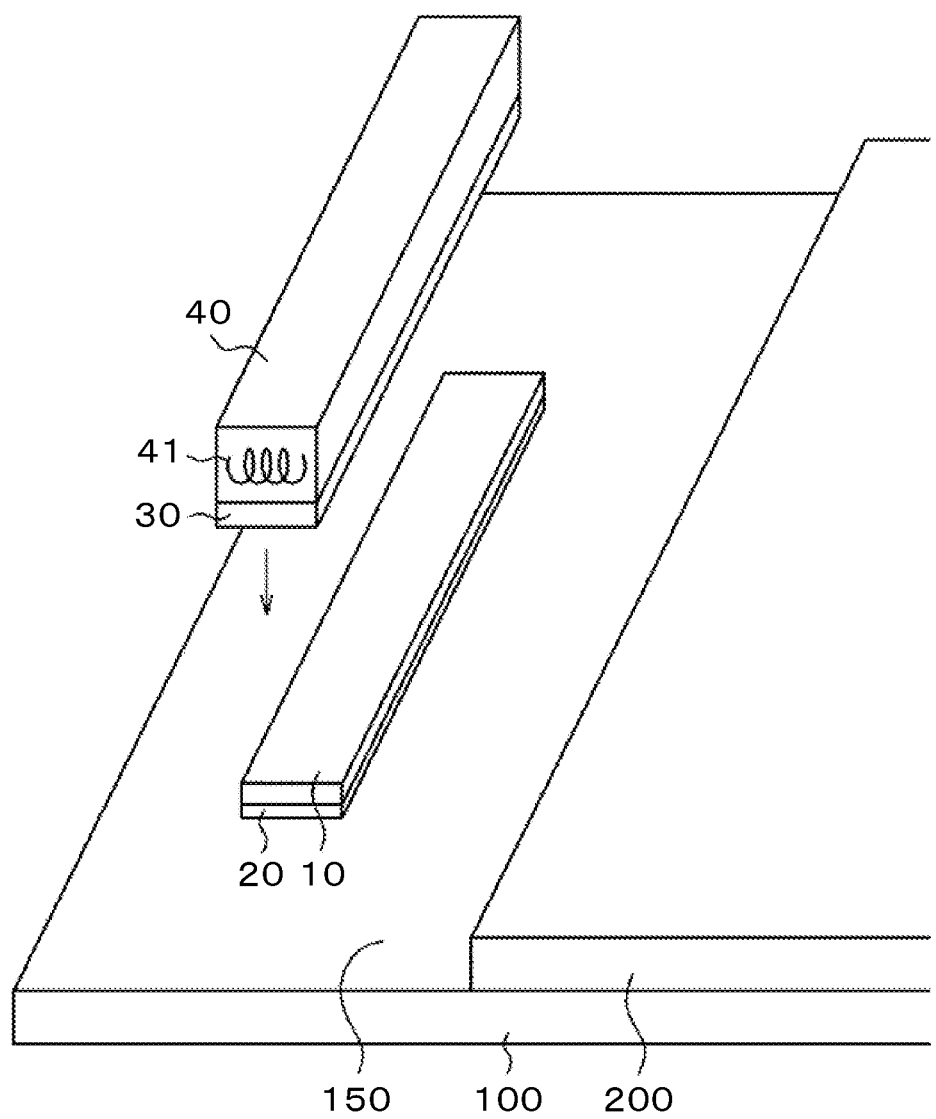
FIG. 2 is a perspective view showing how the driver IC is connected to terminals of a TFT substrate with an ACF interposed therebetween.

FIG. 2 is a perspective view showing how the driver IC 10 is connected to the terminal area 150. In FIG. 2, the driver IC 10 is disposed in the terminal area 150 of the TFT substrate 100 with an ACF 20 interposed therebetween. Numerous bumps are formed on the driver IC 10. These bumps are connected to the terminals formed in the terminal area 150 via the ACF 20.

Figure 3:
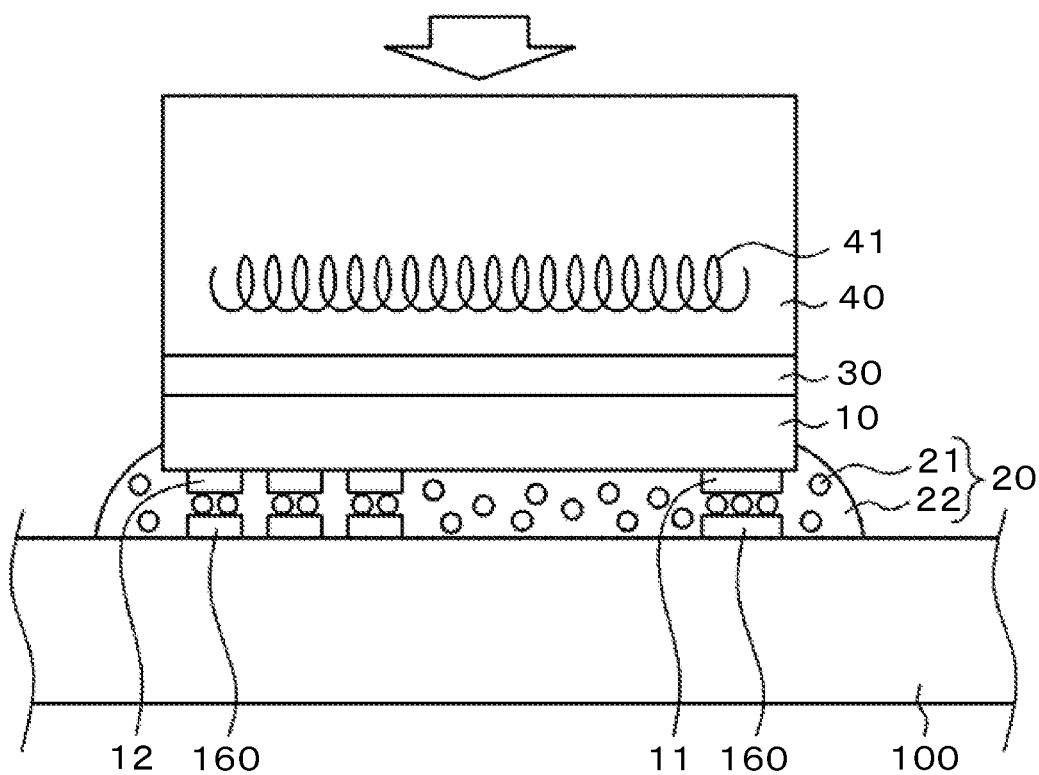
FIG. 3 is a schematic cross-sectional view showing the process in which a driver IC is thermally pressure-bonded.

FIG. 3 is a schematic cross-sectional view showing how the driver IC 10 is connected to the terminal area. In FIG. 3, a pressure bonding head 40 heated by a heater 41 pressure-bonds the driver IC 10 onto the terminal area side with a resin sheet 30 interposed therebetween for buffering purposes. The ACF 20 is disposed between the driver IC 10 and the terminals 160 of the TFT substrate 100. The ACF 20 is configured to be a thermoplastic film 22 sprinkled with conductive particles 21. When thermally pressure-bonded, the conductive particles 21 provide electrically conductive connection between the input bumps 11 or the output bumps 12 and the terminals 160. After thermal pressure bonding, the thermoplastic film 22 acts as an adhesive.

Figure 4:
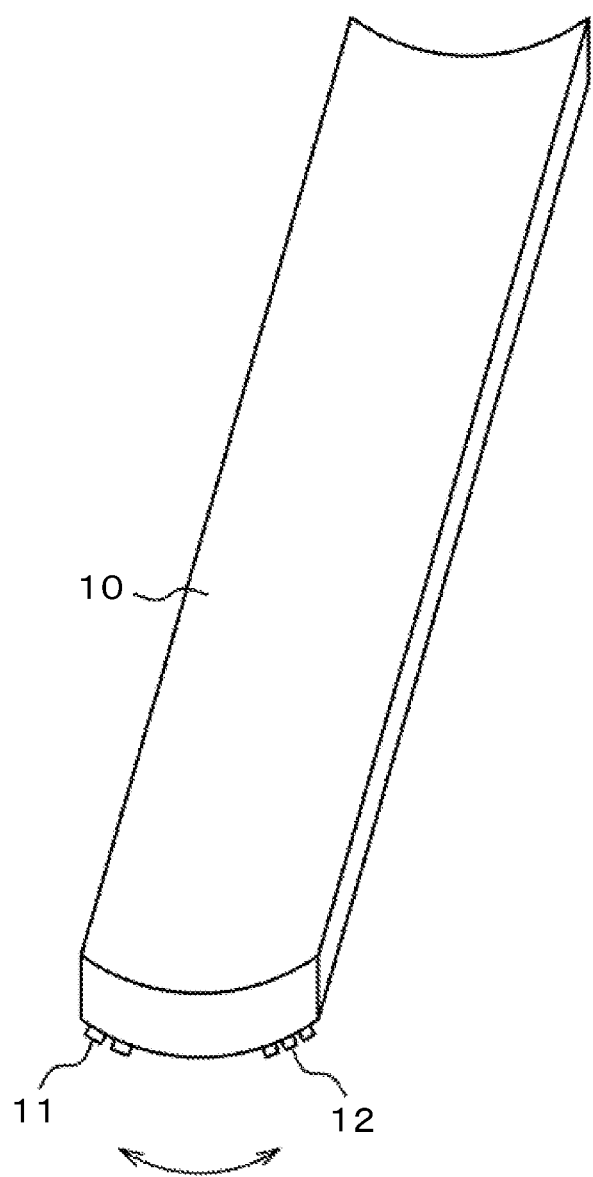
FIG. 4 is a perspective view showing a problem with the driver IC being thermally pressure-bonded.

When pressure-bonded by the pressure bonding head 40 to the TFT substrate 100, the driver IC 10 is bent in the direction of its short sides as shown in FIG. 4. The input bumps 11 are disposed on the first long side of the driver IC 10 and the output bumps 12 are disposed on the second long side. When the driver IC 10 is bent as illustrated in FIG. 4, the input bumps 11 or the output bumps 12 are insufficiently pressure-bonded to the terminals 160, resulting in bad connection.

Figure 5:
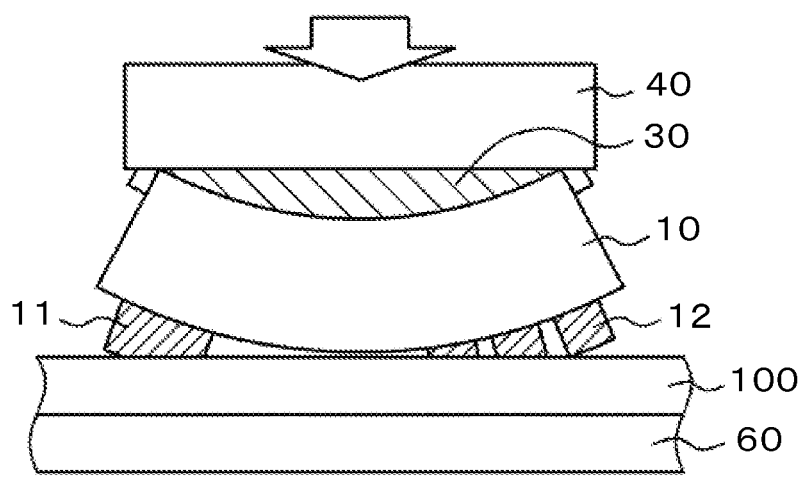
FIG. 5 is a schematic cross-sectional view showing a problem with a first comparative example being thermally pressure-bonded.
Figure 6:
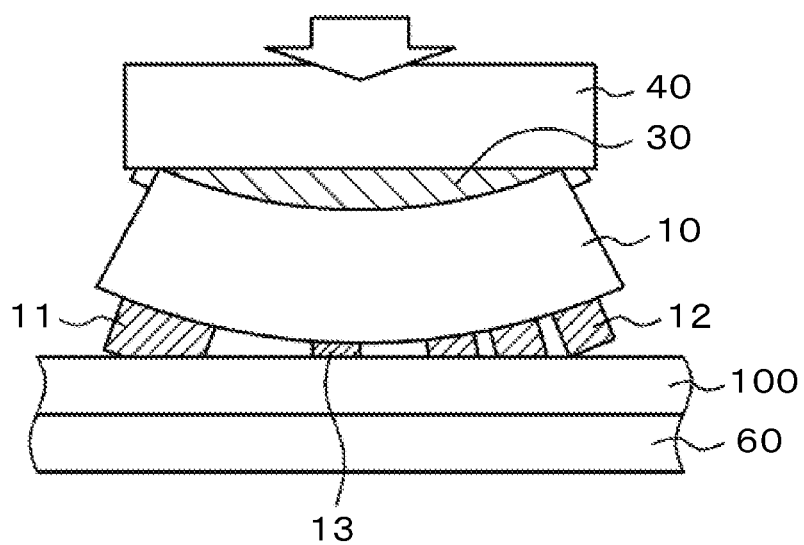
FIG. 6 is a schematic cross-sectional view showing a problem with a second comparative example being thermally pressure-bonded.

FIG. 5 is a schematic cross-sectional view showing how a comparative example is pressure-bonded. In FIG. 5, the TFT substrate 100 is placed on a bearer 60. The driver IC 10 having the bumps 11 and 12 is disposed on the TFT substrate 100. The bumps of the driver IC 10 are thermally pressure-bonded by the pressure bonding head 40 to the TFT substrate 100 with the resin sheet 30 interposed therebetween. At this point, the distributed pressure causes the driver IC 10 to be bent in the direction of its short sides as shown in FIG. 4. This results in an insufficient pressure particularly on the bumps along the long sides of the driver IC 10, leading to bad conduction. The resin sheet 30 is primarily flat in shape. FIGS. 5 and 6 show that the resin sheet 30 is bent and deformed under the distributed pressure.

FIG. 6 shows an example in which dummy bumps 13 are formed between the input bumps 11 and the output bumps 12 to alleviate the bending phenomenon. In FIG. 6, the dummy bumps 13 ease the bending of the driver IC 10 and allow the pressure to be more uniformly distributed over the input bumps 11 and the output bumps 12. However, as will be discussed later, the dummy bumps 13 thus disposed fail to make the pressure bonding force distributed in a sufficiently uniform manner. The other structures in FIG. 6 are the same as those explained above in reference to FIG. 5. It is assumed that the dummy bumps 13 are disconnected at least from the scanning lines or from the video lines and that they are used solely for the purpose of easing the bending of the driver IC 10 at the time of thermal pressure bonding.

Figure 7:
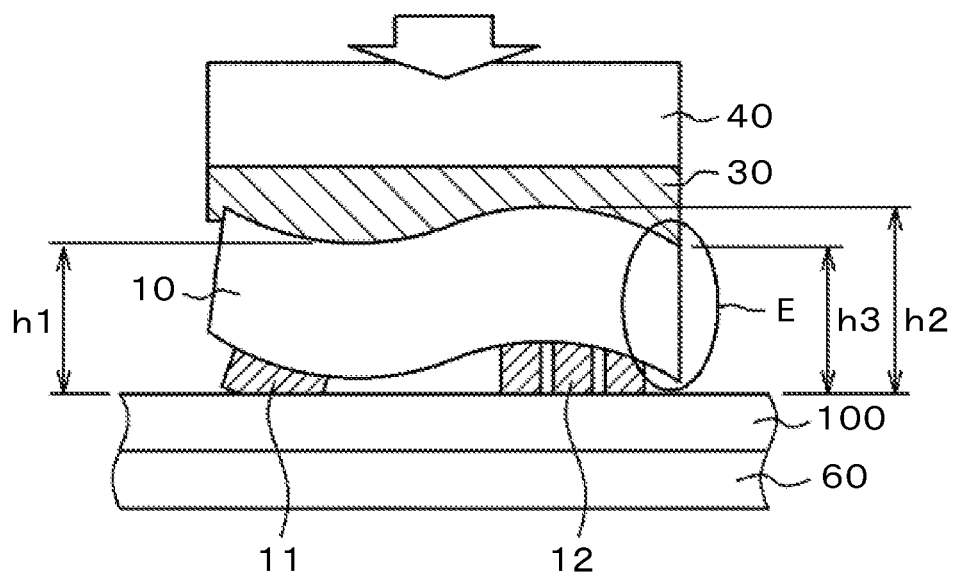
FIG. 7 is a schematic cross-sectional view showing how a first embodiment of the present invention is thermally pressure-bonded.

FIG. 7 is a schematic cross-sectional view showing how a first embodiment of the present invention is configured to counter this problem. The configuration in FIG. 7 is characterized by a longer distance between the driver IC edge and the output bumps 12 formed in multiple rows on the driver IC 10, as indicated by a region E. This overhanging portion of the configuration will be referred to as the eaves in the ensuing description.

The configuration above allows the driver IC 10 to be bent as shown in FIG. 7 at the time of pressing bonding. What characterizes that manner of bonding is that the driver IC 10 is bent upward around the midpoint between the input bumps 11 and the output bumps 12 and bent downward from around the middle of the output bumps 12 toward the edge of the driver IC 10. In other words, when the bumps are viewed on the cross section of the driver IC 10, there are different distances between the driver IC 10 and the TFT substrate 100: in FIG. 7, reference character h1 denotes the distance from the driver IC 10 surface at the midpoint between the input bumps 11 and the output bumps 12 to the TFT substrate 100; h2 represents the distance from the driver IC 10 surface over the output bumps 12 to the TFT substrate 100; and h3 stands for the distance from the top of the driver IC 10 edge to the TFT substrate 100, where h1<h2 and h3<h2.

When the driver IC 10 is bent in this manner, the output bumps 12 on the outer side are given a larger pressure bonding force against the substrate. This improves the reliability of the outer rows of the output bumps 12 being connected. Whether the driver IC 10 will be shaped as shown in FIG. 7 when pressure-bonded to the substrate terminals depends on the thickness of the driver IC 10 and on the width of its eaves.

Figure 8:
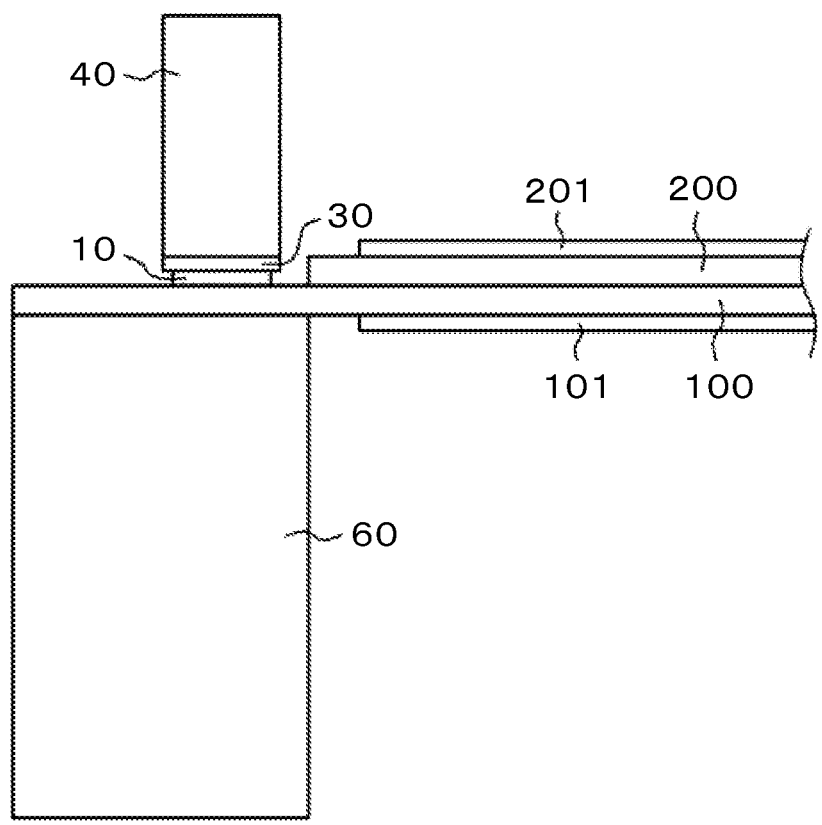
FIG. 8 is a schematic cross-sectional view showing the process of thermal pressure bonding.
Figure 9:
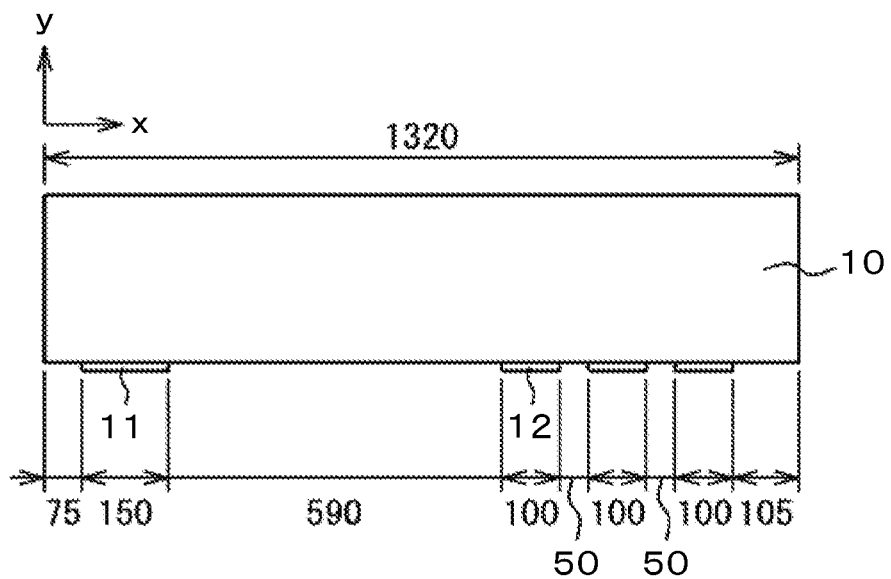
FIG. 9 is a cross-sectional view of a driver IC used for simulations.
Figure 10:
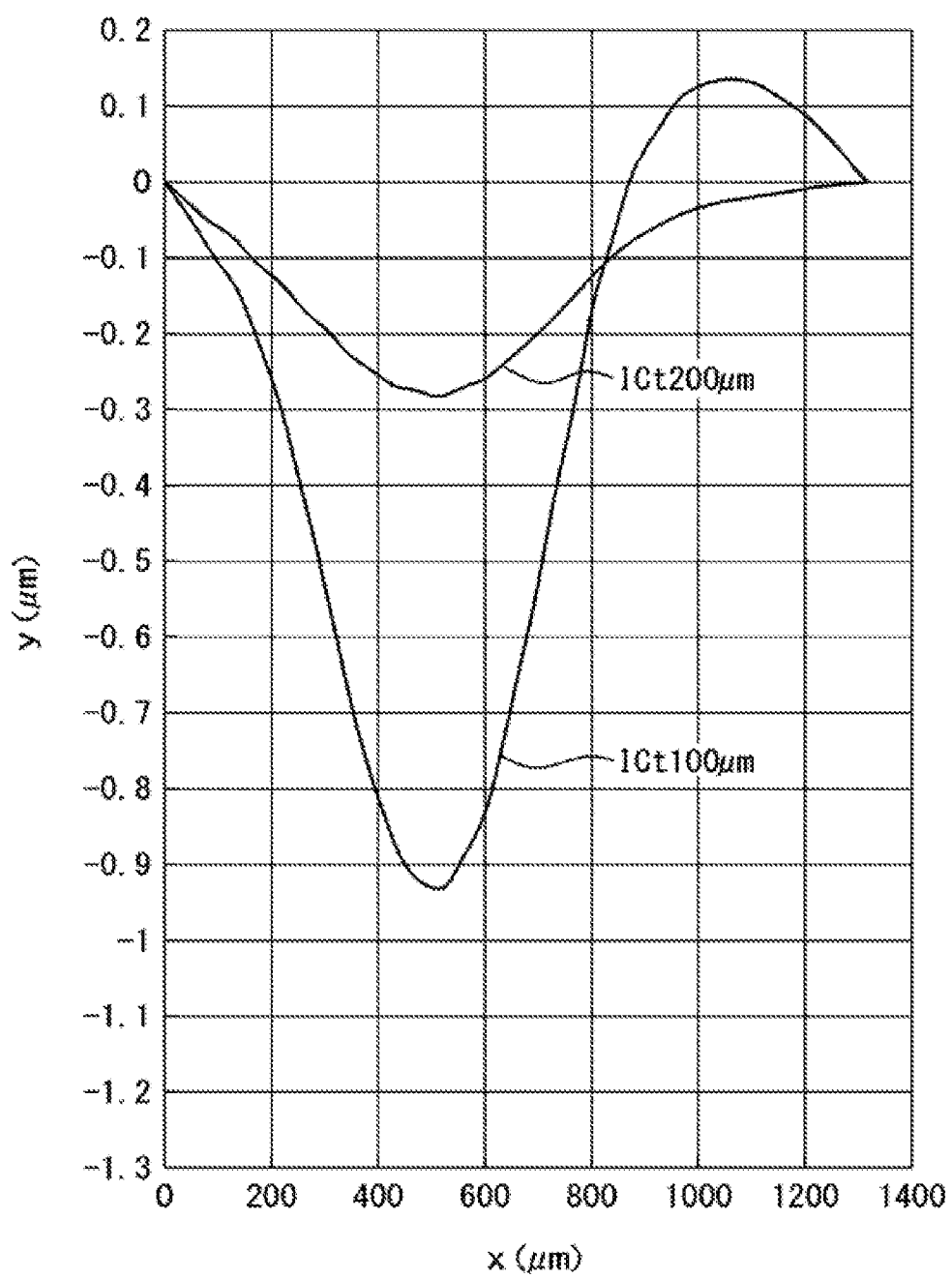
FIG. 10 is a graphic representation showing some result of the simulations.

FIGS. 8 to 10 depict evaluations made of the curves of the bump-side faces of specific driver ICs 10 simulated on their cross sections. FIG. 8 is a cross-sectional view showing how the driver IC 10 is thermally pressure-bonded to the TFT substrate 100 of a liquid crystal display panel. In FIG. 8, the liquid crystal display panel has the TFT substrate 100 overlaid with the counter substrate 200. A lower polarizing plate 101 is bonded to the underside of the TFT substrate 100. An upper polarizing plate 201 is bonded to the upper side of the counter substrate 200. The driver IC 10 is thermally pressure-bonded to the terminal area of the TFT substrate 100 with the resin sheet 30 interposed therebetween.

FIG. 9 is a cross-sectional view taken in the direction of the short sides of a driver IC being evaluated. In FIG. 9, one row of input bumps is disposed on the left and three rows of output bumps are disposed on the right. The values in FIG. 9 are given in micrometers. For example, the short side dimension of the driver IC 10 is 1,320 μm. In FIG. 9, the distance between the outermost row of the output bumps 12 and the edge of the driver IC 10, i.e., the width of eaves, is 105 μm. The width of eaves on the side of the input bumps 11 is 75 μm. The eaves on the side of the output bumps 12 are wider than the eaves on the side of the input bumps 11.

FIG. 10 depicts the state in which driver ICs 10 are bent on the bump side when thermally pressure-bonded to the TFT substrate 100 as indicated in FIG. 8. In FIG. 10, the driver ICs 10 are evaluated with the layout of their bumps and the width of their eaves kept identical but with their thicknesses switched between 100 μm and 200 μm.

In FIG. 10, the point x=0 represents the left edge of the driver IC 10 in FIG. 9. The point y=0 denotes the left edge of the underside of the driver IC 10 in FIG. 9. FIG. 10 shows how the driver ICs 10 have their undersides bent between their left edge and their right edge. In the case of the driver IC 10 of which the board thickness is 100 μm, the driver IC 10 is bent downward from the left edge to 450 nm to the right. From there, the driver IC 10 is bent upward and peaks at around 1,050 μm to the right. Past the peak, the board is again bent downward toward the right edge of the driver IC 10.

In the case of the driver IC 10 of which the board thickness is 200 μm, the driver IC 10 is bent downward from the left edge toward 450 μm or thereabouts to the right. Past the curve bottom, the driver IC 10 is bent upward to the right and peaks at around the right edge of the driver IC 10.

Such curves of the driver IC surface are dependent on the board thickness of the driver IC 10 and on the width of eaves shown in FIG. 9. Even where the driver IC 10 is 200 μm thick, making the eaves wider than 105 μm shifts the peak inward from the right edge. Then there occurs a region that is bent downward past the peak.

If the surface curve of the driver IC 10 has an upward convex region near the bumps as shown in FIG. 10 on the cross-section of the driver IC 10 taken in the direction of the short sides, a sufficient pressure bonding force is ensured on the outermost terminals. This ensures reliable connection of the driver IC 10. In the case of the driver IC 10 that is 100 μm thick as shown in FIG. 10, if the horizontal axis is denoted by x and the vertical axis by y, then y is represented by a function of x, i.e., by f(x).

In the case above, where f(x) gives a downward concave curve, the secondary differentiation of f(x) is positive; where f(x) gives an upward convex curve, the secondary differentiation of f(x) is negative. That is, the curve of the driver IC 10 with the thickness of 100 μm as shown in FIG. 10 may be said to represent the case where the secondary differentiation of f(x) is positive as well as negative. Most preferred is the case in which f(x) gives its maximum value in a region where the secondary differentiation of f(x) is negative.

Incidentally, curves such as those shown in FIG. 10 can be evaluated using the function $f(x)=ax^2+bx^4+cx^6$ in many cases. The values a, b, and c can be found easily by solving simultaneous equations based on measured data. Thus the sign of the secondary differentiation of f(x) can also be evaluated easily.

FIGS. 11 to 17 show typical evaluations made of the pressure bonding force applied to each bump when the width of the eave is changed. That is, whereas a minimum pressure bonding force Min on the bumps is required to be at least a predetermined value, the simulations indicate that the minimum pressure bonding force can be raised by adjusting the width of eaves.

Figure 11:
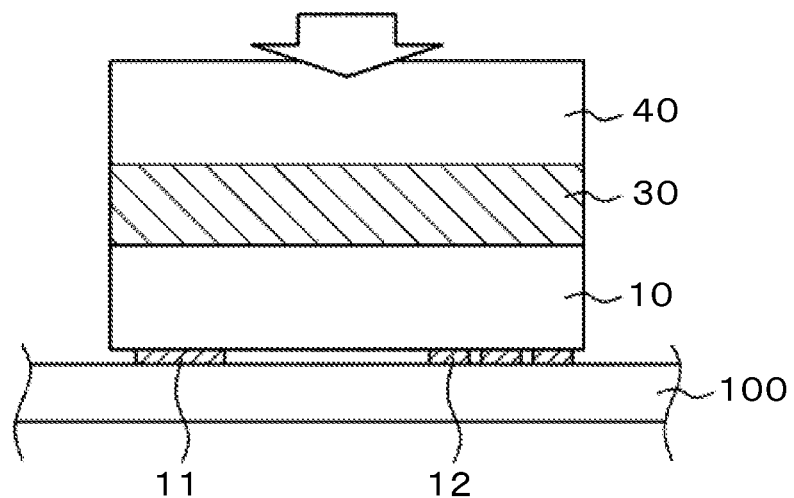
FIG. 11 is a schematic cross-sectional view showing the first comparative example being thermally pressure-bonded.
Figure 12:
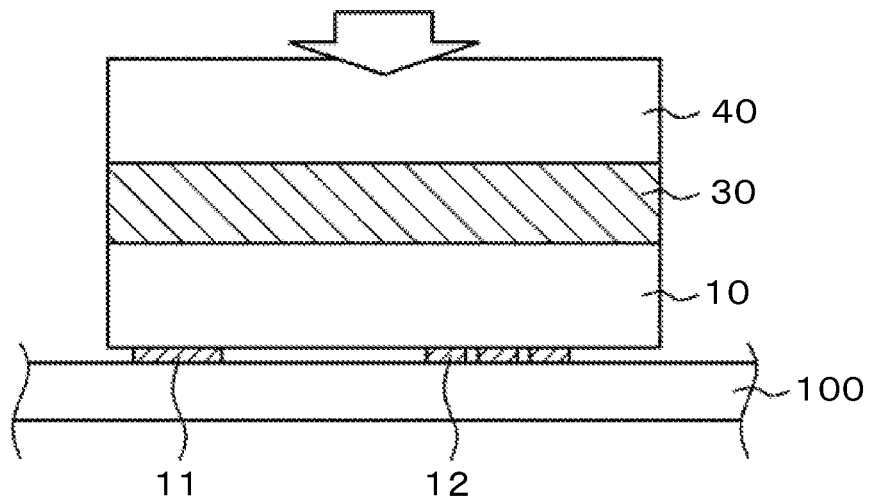
FIG. 12 is a schematic cross-sectional view showing a first mode and a second mode of the first embodiment being thermally pressure-bonded.

FIG. 11 is a cross-sectional view of the driver IC 10 as the first comparative example of which the width of eaves we is 50 μm or thereabouts, equivalent to that of existing types, the driver IC 10 being thermally pressure-bonded to the substrate 100. In FIG. 11, the driver IC 10 is pressured by the pressure bonding head against the substrate 100 with the resin sheet 30 interposed therebetween. The ACF is not shown in FIG. 11. FIG. 12 is a cross-sectional view showing how the driver IC 10 as the first embodiment of this invention is thermally pressure-bonded to the TFT substrate 100. In FIG. 12, the driver IC 10 is evaluated in two cases, one in which the width of eaves we is 150 μm and one in which the width of eaves we is 300 μm. The other structures in FIG. 12 are the same as those explained above in reference to FIG. 11. In FIGS. 11 and 12, the driver IC 10 is 200 μm thick and the resin sheet 30 is 50 μm thick.

Figure 13:
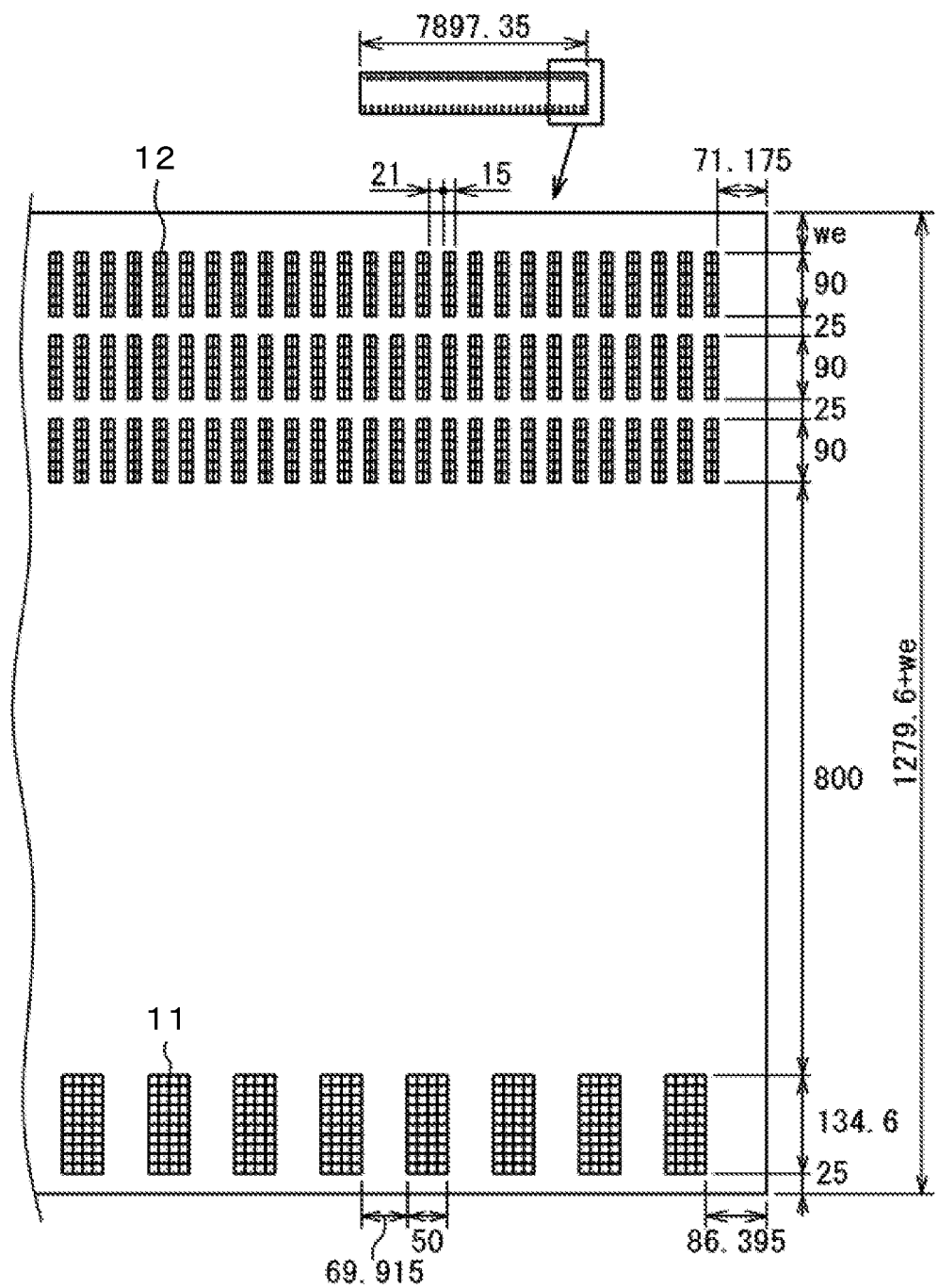
FIG. 13 is a plan view showing a typical layout of bumps of the driver IC.

FIG. 13 is a plan view showing a typical layout of the bumps of the driver IC 10 in FIG. 11 or 12. The upper subfigure in FIG. 13 is an overall plan view showing the surface of the driver IC 10 having the bumps formed thereon. The portion of the subfigure enclosed by a rectangle on its right is detailed in a detail plan constituting the lower subfigure in FIG. 13. The values in FIG. 13 are dimensions given in micrometers. In FIG. 13, one row of the input bumps 11 is formed on one side of the driver IC 10, and three rows of the output bumps 12 are formed on the opposite side. The width of the driver IC 10 is given as 1,279.6+we. That is, the width of the driver IC 10 varies depending on the width of eaves we.

Figure 14:
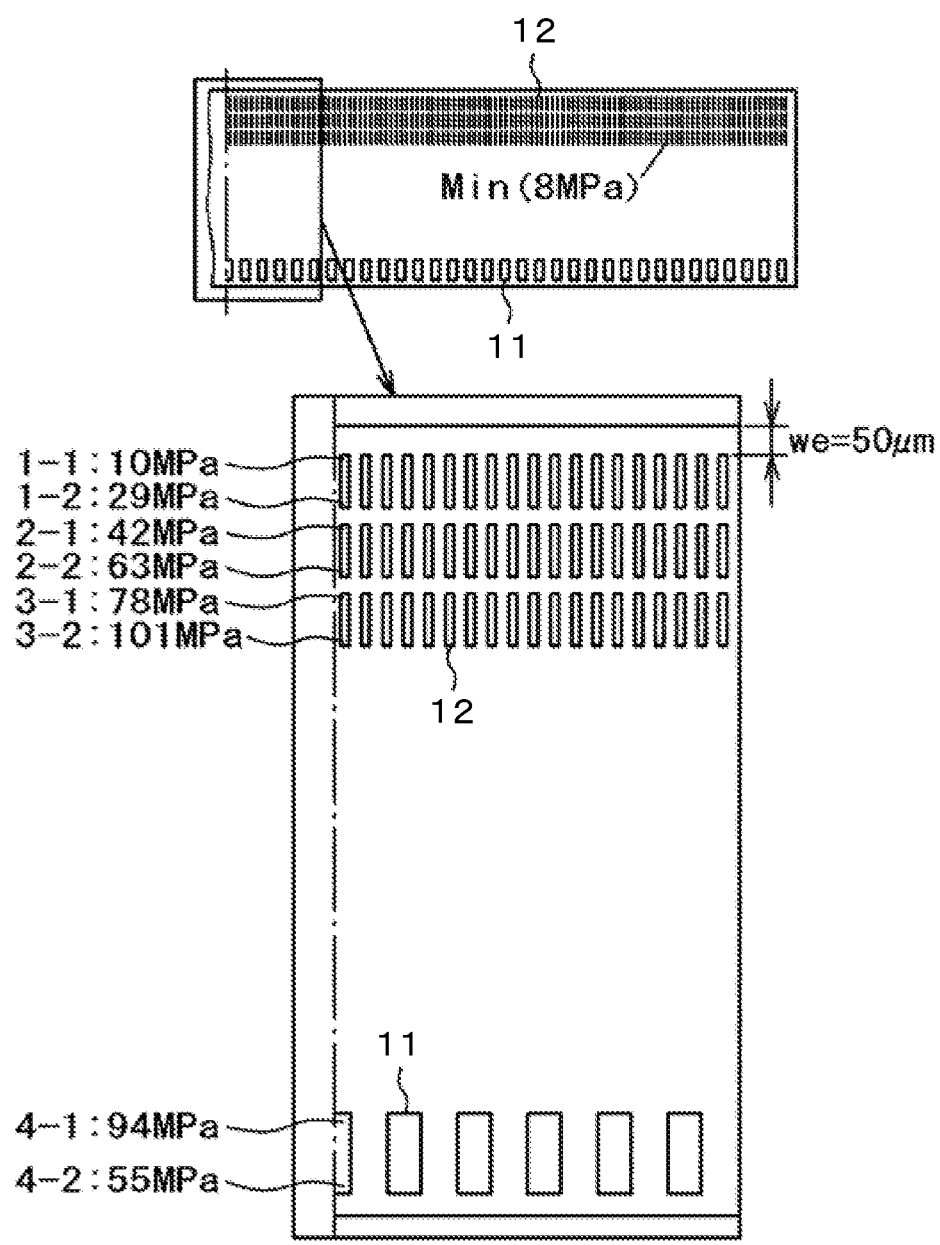
FIG. 14 is a schematic view showing how pressure bonding force is distributed over the bumps of the first comparative example.
Figure 15:
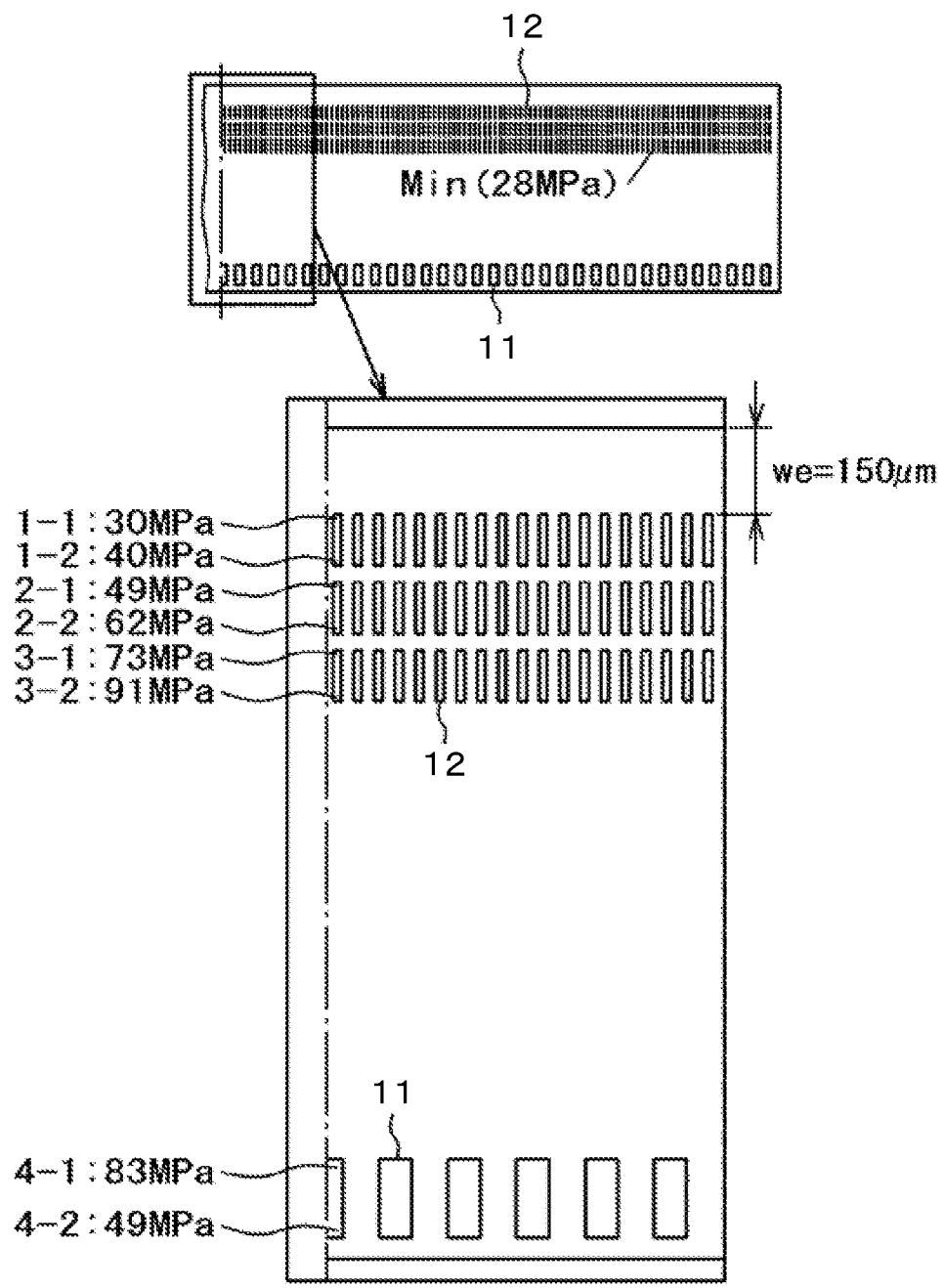
FIG. 15 is a schematic view showing how pressure bonding force is distributed over the first mode of the first embodiment.
Figure 16:
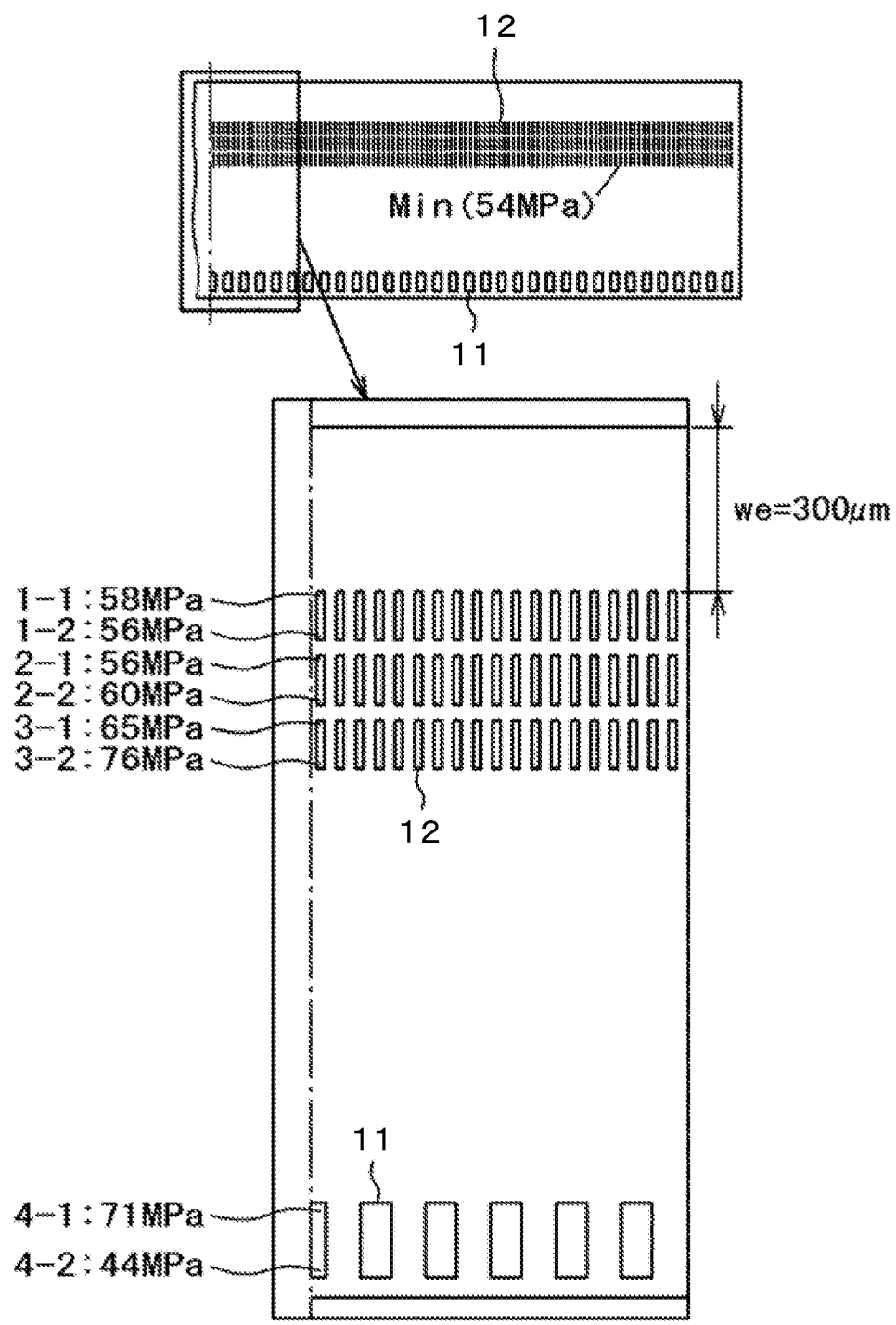
FIG. 16 is a schematic view showing how pressure bonding force is distributed over the second mode of the first embodiment.

FIGS. 14 to 16 show cases where, following the thermal pressure bonding performed as shown in FIGS. 11 and 12, the width of eaves we of the driver IC 10 is varied in evaluating the pressure bonding force on the terminals. Incidentally, the pressure bonding force may be referred to as bump contact pressure elsewhere, both signifying the same force. The widths of eaves we on the output bump side are different among the first comparative example in FIG. 14, a first mode of the first embodiment in FIG. 15, and a second mode of the first embodiment in FIG. 16. The width we is 50 μm in FIG. 14, 150 μm in FIG. 15, and 300 μm in FIG. 16. FIGS. 14 to 16 indicate cases where there are no dummy bumps.

In each of FIGS. 14 to 16, the upper subfigure shows a right half of the bump side surface of the driver IC 10. Also in each of FIGS. 14 to 16, the lower subfigure is a detail view showing how the pressure bonding force is distributed over the region enclosed by a rectangle near the center of the driver IC 10 in the upper subfigure. Reference character MPa in FIGS. 14 to 16 stands for megapascals, a measure of pressure.

In the driver IC 10 shown in the upper subfigure in each of FIGS. 14 to 16, reference character Min indicates the location where the pressure bonding force is minimal. The location where the pressure bonding force is minimal is approximately the same in FIGS. 14 to 16, except that values of the minimum pressure bonding force are different. One object of the present invention is to eliminate the locations where the pressure bonding force on the bumps is extremely low, i.e., to raise the minimum pressure bonding force.

With the first comparative example in FIG. 14, the minimum pressure bonding force is 8 MPa. With the first mode of the first embodiment in FIG. 15, the minimum pressure bonding force is 28 MPa, which is a significant improvement over the first comparative example. With the second mode of the first embodiment in FIG. 16, the minimum pressure bonding force is 54 MPa, which is a further improvement.

In the lower subfigure in each of FIGS. 14 to 16, the values associated with the bumps denote the pressure bonding force on these bumps. In FIGS. 14 to 16, one row of the input bumps 11 and three rows of the output bumps 12 are formed. In the lower subfigure in each of FIGS. 14 to 16, reference numeral 1-1 stands for the pressure bonding force on the outer side of the outermost row of the output bumps 12, and 1-2 for the pressure bonding force on the inner side of the same bumps. Reference numeral 2-1 stands for the pressure bonding fore on the outer side of the middle row of the output bumps 12, and 2-2 for the pressure bonding force on the inner side of the same bumps. Reference numeral 3-1 stands for the pressure bonding force on the outer side of the innermost row of the output bumps 12, and 3-2 for the pressure bonding force on the inner side of the same bumps. Reference numeral 4-1 stands for the pressure bonding force on the inner side of the input bumps 11, and 4-2 for the pressure bonding force on the outer side of the same bumps.

As shown in FIGS. 14 to 16, the pressure bonding force varies even in regard to the same row of bumps. It is preferred that the pressure bonding force be as much uniform as possible between rows of bumps as well as within each row of bumps. In FIG. 14 showing the first comparative example, the pressure bonding force is 10 MPa on the location 1-1 but 101 MPa on the location 3-2, the difference therebetween being significantly large. That is, the pressure bonding force may not be sufficient on the outer side bumps.

In FIG. 15 showing the first mode of the first embodiment, the pressure bonding force is 30 MPa on the location 1-1 and 91 MPa on the location 3-2. The distribution of the pressure bonding force is appreciably improved compared with the first comparative example. The improvement is attributable to the widened eaves. In FIG. 16 showing the second mode of the first embodiment, the pressure bonding force is 58 MPa on the location 1-1 and 76 MPa on the location 3-2. This is a further improvement in terms of pressure bonding force distribution.

Figure 17:
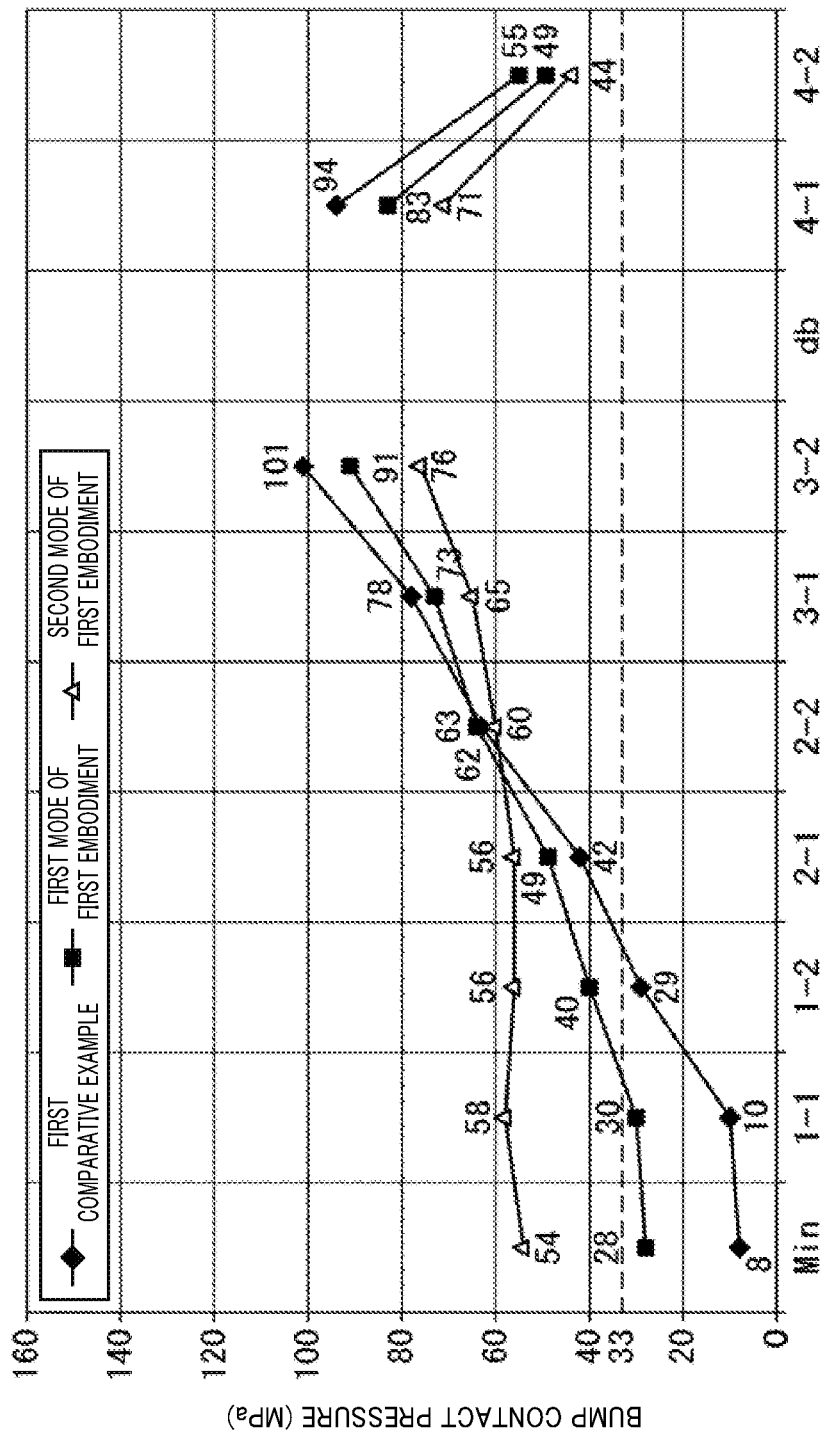
FIG. 17 is a graphic representation showing differences in pressure bonding force between the first comparative example and the first and the second modes of the first embodiment.

FIG. 17 is a graphic representation plotting the results of the evaluations in FIGS. 14 to 16. In FIG. 17, the horizontal axis represents the locations where the pressure bonding force is measured as explained above in reference to FIGS. 14 to 16. Reference character db denotes the location of dummy bumps that are not included in FIGS. 14 to 16, so that there is no data on that location. Reference character Min denotes the location where the pressure bonding force is minimal in the upper subfigure in each of FIGS. 14 to 16. The vertical axis in FIG. 17 stands for the bump contact pressure, i.e., pressure bonding force measured in MPa.

In FIG. 17, a dotted line indicative of the pressure of 33 MPa represents the level where the load per conductive particle is 1.5 millinewtons (mN). This is a rule-of-thumb pressure required to ensure stable conduction with each conductive particle. The relations between the load and the pressure bonding force (bump contact pressure) per conductive particle are as follows: the planar dimension of each output bump is 90×15 µm=1,350 µm$^2$. The number of conductive particles per output bump is 30. If the load per conductive particle is assumed to be 1.5 mN, the load per bump amounts to 45 mN. The pressure bonding force per bump is given as 45 mN/1,350 µm$^2$, i.e., $45 \times 10^{-3}/1,350 \times 10^{-12} = 33 \times 10^6$, which amounts to 33 MPa.

With the first comparative example in FIG. 17, the minimum value of the pressure bonding force, i.e., bump contact pressure, is 8 MPa and the maximum value is 101 MPa. The maximum value is more than 10 times as high as the minimum value. The minimum value is significantly below the bump contact pressure of 33 MPa, the rule-of-thumb load required to be applied to each conductive particle. Thus there is concern that the bumps on which the pressure bonding force is minimal can develop bad connection due to insufficient pressure bonding force.

Meanwhile, with the first mode of the first embodiment, the minimum value of the bump contact pressure is 28 MPa and the maximum value is 91 MPa. That means the pressure bonding force is distributed in a significantly uniform manner. The minimum value of 28 MPa is fairly close to the bump contact pressure of 33 MPa, which is the rule-of-thumb load required to be applied to each conductive particle. The reliability of the conductivity with the first mode is appreciably improved compared with the first comparative example.

With the second mode of the first embodiment, the minimum value of the pressure bonding force, i.e., bump contact pressure, is 54 MPa and the maximum value is 76 MPa. The pressure bonding force is thus distributed in a significantly uniform manner. The minimum value of 54 MPa is appreciably higher than the bump contact pressure of 33 MPa, which is the rule-of-thumb load required to be applied to each conductive particle. The reliability of the conductivity with the second mode is also improved appreciably.

FIGS. 18 to 24 show how the pressure bonding force per bump is evaluated where the eaves of the driver ICs 10 having the dummy bumps 13 are widened. That is, the evaluations explained above in reference to FIGS. 11 to 17 are also made of the driver ICs 10 having the dummy bumps.

Figure 18:
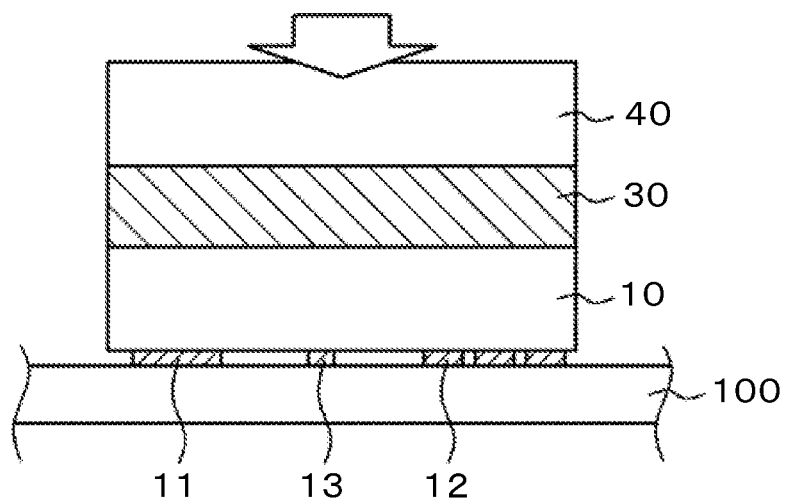
FIG. 18 is a schematic cross-sectional view showing a second comparative example being thermally pressure-bonded.
Figure 19:
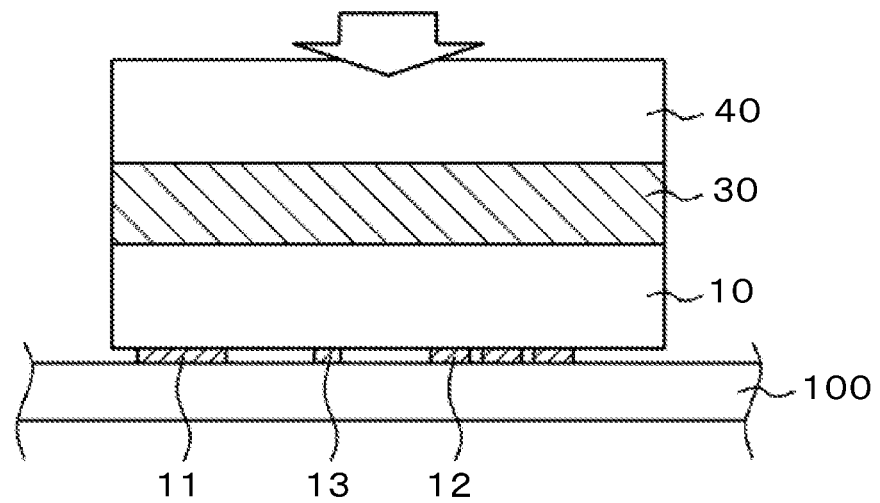
FIG. 19 is a cross-sectional view showing a third mode and a fourth mode of the first embodiment being thermally pressure-bonded.

FIG. 18 is a cross-sectional view showing a driver IC 10 having the dummy bumps as a second comparative example of which the width of eaves we is about 50 µm, i.e., which has the eaves approximately as wide as those of existing types, the driver IC 10 being thermally pressure-bonded to the TFT substrate 100. The driver IC 10 in FIG. 18 is the same as that explained above in reference to FIG. 11 except that it has dummy bumps 13. FIG. 19 is a schematic cross-sectional view showing how the driver IC 10 is evaluated in two cases, one in which the width of eaves we is 150 µm and one in which the width of eaves we is 300 µm. The driver IC 10 in FIG. 19 is structured the same as explained above in reference to FIG. 18 except that the width of eaves of the driver IC 10 is different. In FIGS. 18 and 19, the driver IC is 200 µm thick and the resin sheet is 50 µm thick.

Figure 20:
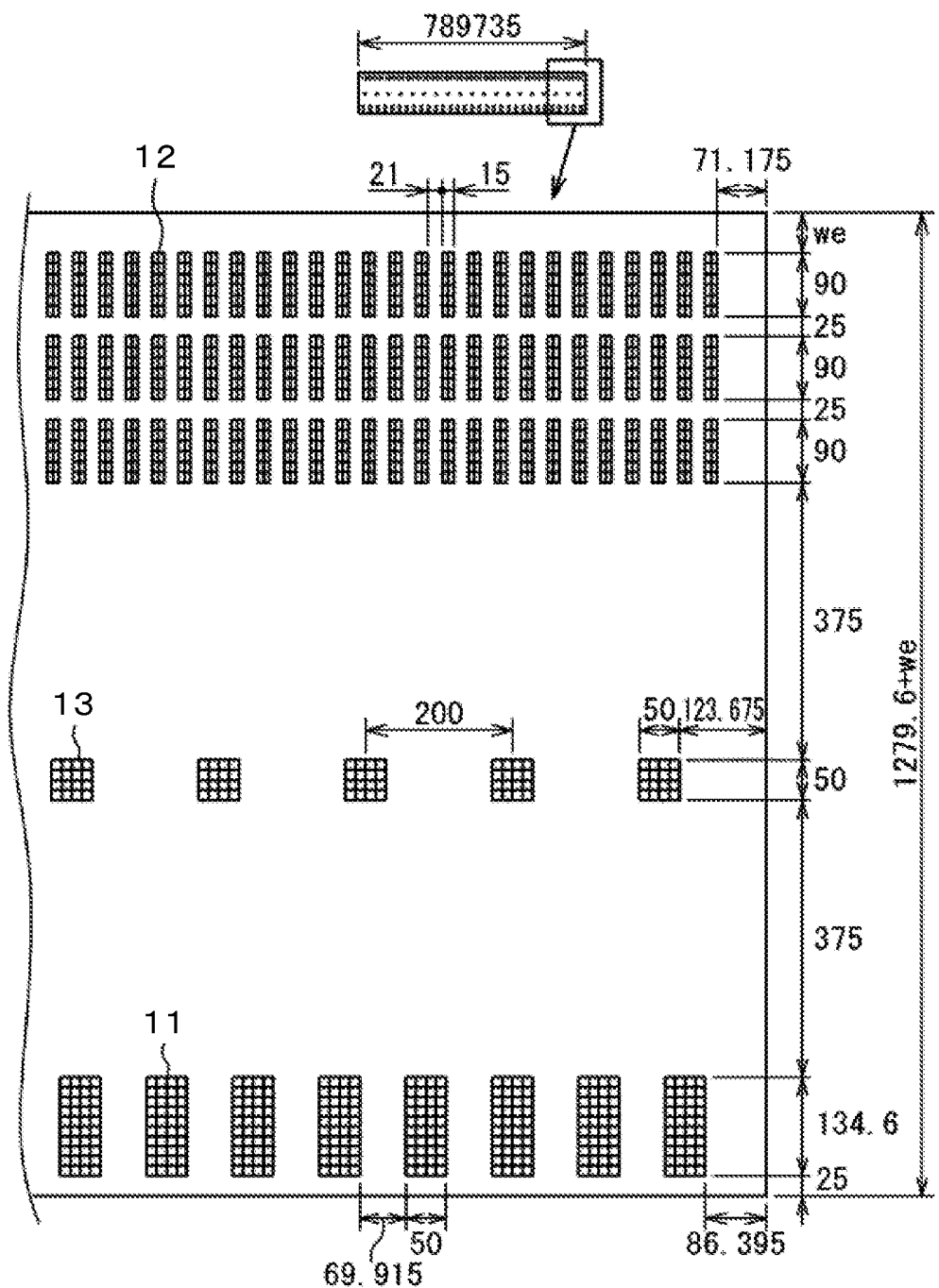
FIG. 20 is a schematic view showing a typical layout of bumps including dummy bumps on the driver IC.

FIG. 20 is a plan view showing a typical layout of bumps of the driver IC 10 in FIG. 18 or 19. The driver IC 10 in FIG. 20 is the same as that explained above in reference to FIG. 13 except that there are dummy bumps 13 between the input bumps 11 and the output bumps 12. The dummy bumps 13 each measure 50 µm by 50 µm and are arrayed at a pitch of 200 µm.

Figure 21:
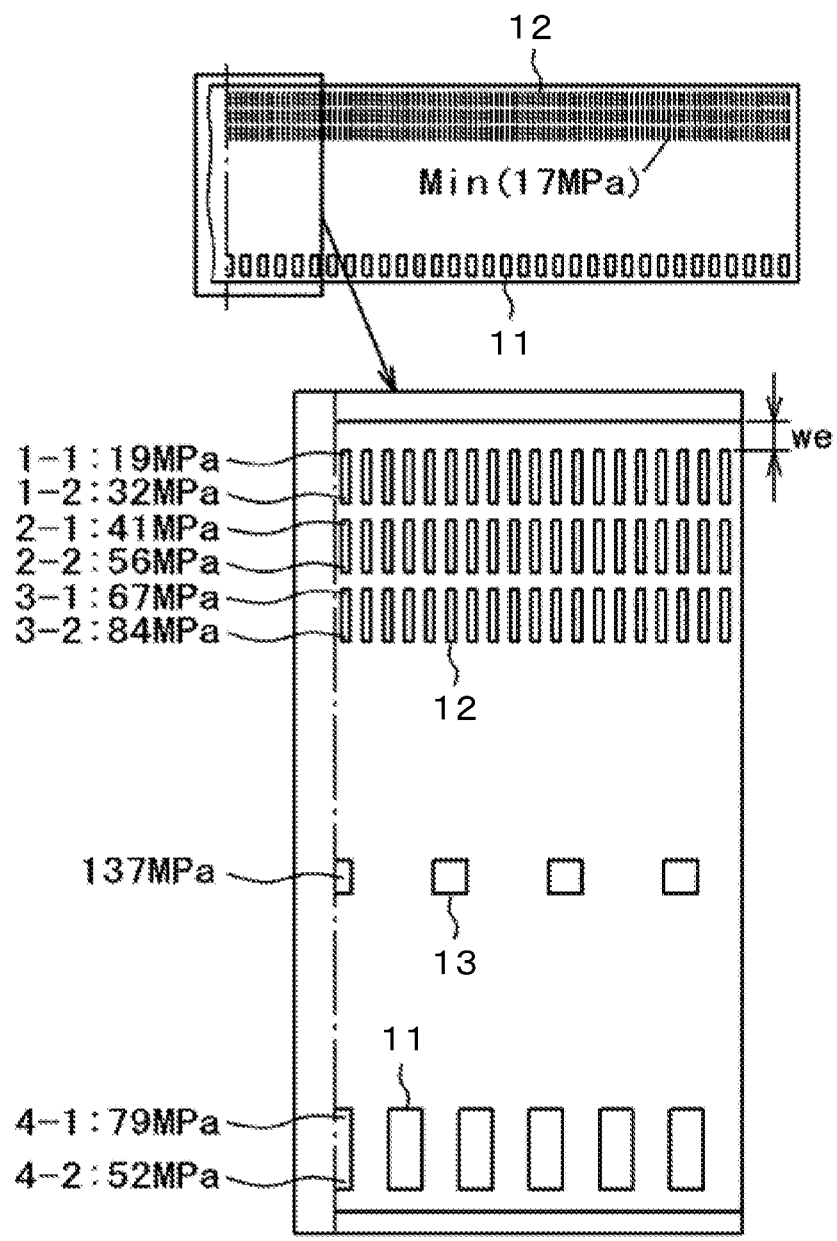
FIG. 21 is a schematic view showing how pressure bonding force is distributed over the bumps of the first comparative example.
Figure 22:
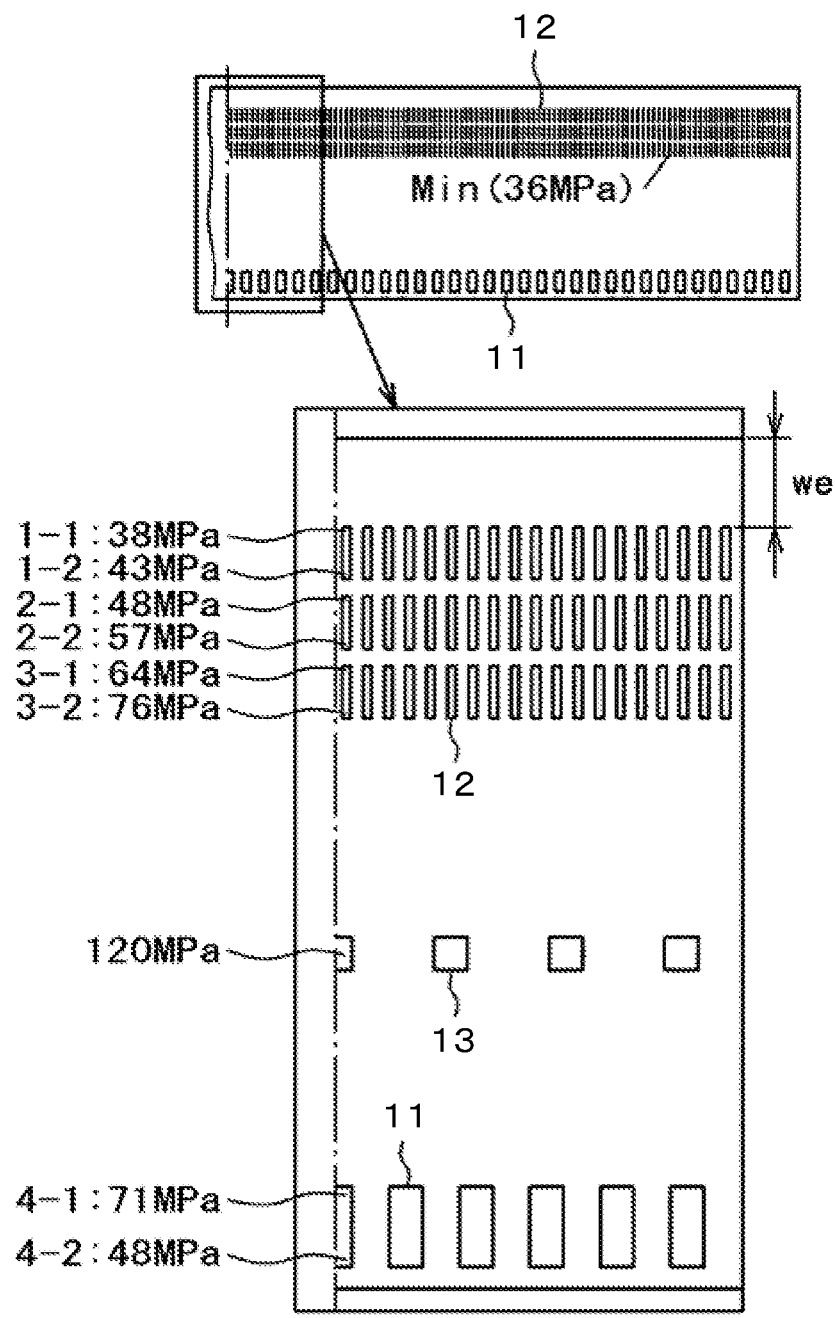
FIG. 22 is a schematic view showing how pressure bonding force is distributed over the third mode of the first embodiment.
Figure 23:
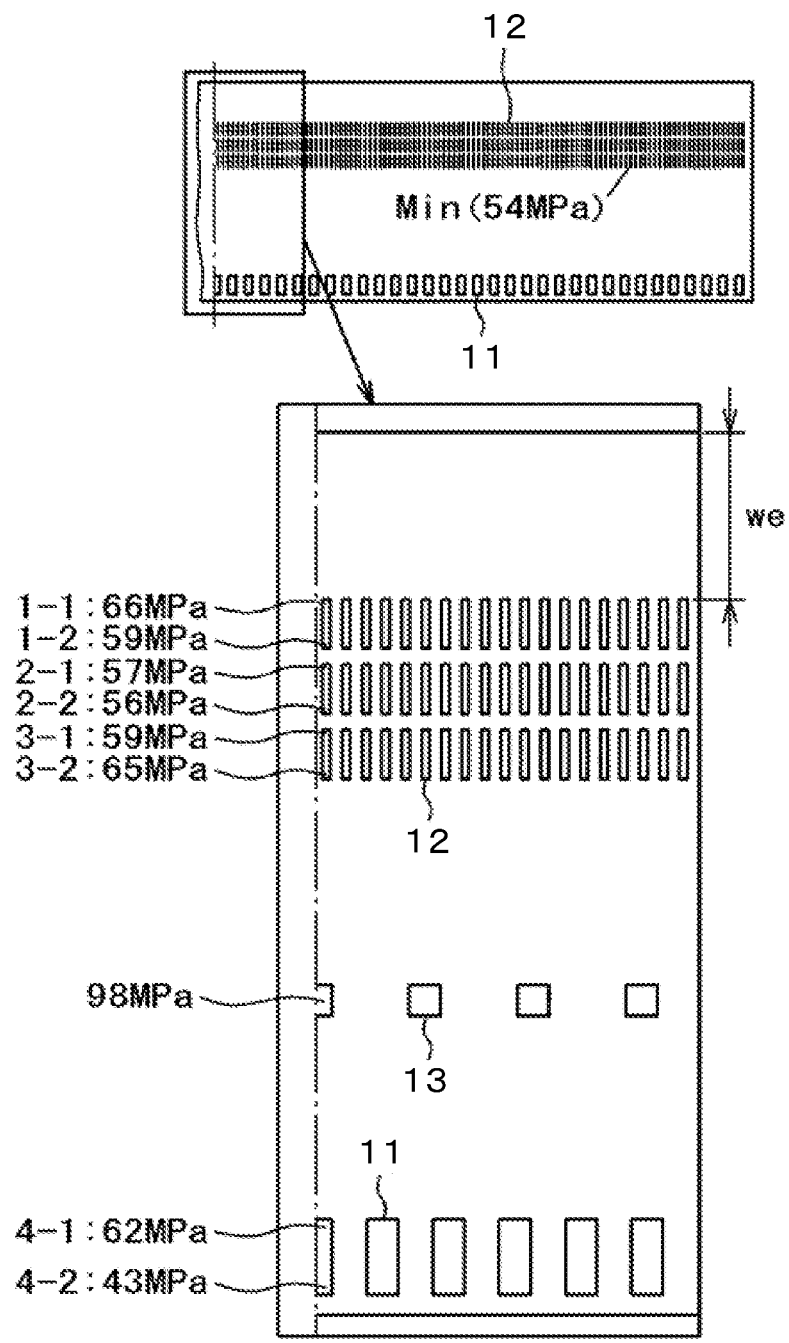
FIG. 23 is a schematic view showing how pressure bonding force is distributed over the fourth mode of the first embodiment.

FIGS. 21 to 23 show the results of the evaluations made of the pressure bonding force on each terminal where the driver ICs 10 are thermally pressure-bonded as indicated in FIGS. 18 and 19 with their widths of eaves varied. The widths of eaves we on the output bump side are different among the second comparative example in FIG. 21, a third mode of the first embodiment in FIG. 22, and a fourth mode of the first embodiment in FIG. 23. The width of eaves we is 50 µm in FIG. 21, 150 µm in FIG. 22, and 300 µm in FIG. 23. The driver ICs 10 in FIGS. 21 to 23 are the same as those explained above in reference to FIGS. 14 to 16 except that the dummy bumps are involved.

In the driver IC 10 shown in the upper subfigure in each of FIGS. 21 to 23, reference character Min indicates the location where the pressure bonding force is minimal. The location on which the pressure bonding force is minimal is approximately the same in FIGS. 21 to 23, except that values of the minimum pressure bonding force are different. One object of the present invention is to eliminate the locations where the pressure bonding force on the bumps is extremely low, i.e., to raise the minimum pressure bonding force.

With the second comparative example in FIG. 21, the minimum pressure bonding force is 17 MPa. This is an improvement over the first comparative example thanks to the effect of the dummy bumps. However, the force amounts to only half of 33 MPa, which is the rule-of-thumb load. In FIG. 22 showing the third mode of the first embodiment, the minimum pressure bonding force is 36 MPa exceeding the rule-of-thumb load of 33 MPa. In FIG. 23 showing the fourth mode of the first embodiment, the minimum pressure bonding force is 54 MPa. This is a still further improvement.

In the lower subfigure in each of FIGS. 21 to 23, the values associated with the bumps indicate the pressure bonding force on the bumps. The configuration in FIGS. 21 to 23 is the same as explained above in reference to FIGS. 14 to 16 except that there are dummy bumps.

As shown in FIGS. 21 to 23, the pressure bonding force varies even on a single bump. It is preferred that the pressure bonding force be as much uniform as possible between bumps as well as on each bump. In FIG. 21 showing the second comparative example, the pressure bonding force is 19 MPa on the location 1-1 and 84 MPa on the location 3-2. This is an improvement over the first comparative example, but the difference involved is still significant.

In FIG. 22 showing the third mode of the first embodiment, the pressure bonding force is 38 MPa on the location 1-1 and 76 MPa on the location 3-2. This is a significant improvement over the second comparative example in terms of pressure bonding force distribution. The improvement is attributable to the widened eaves. In FIG. 23 showing the fourth mode of the first embodiment, the pressure bonding force is 66 MPa on the location 1-1 and 65 MPa on the location 3-2. This is a further improvement in terms of pressure bonding force distribution.

Figure 24:
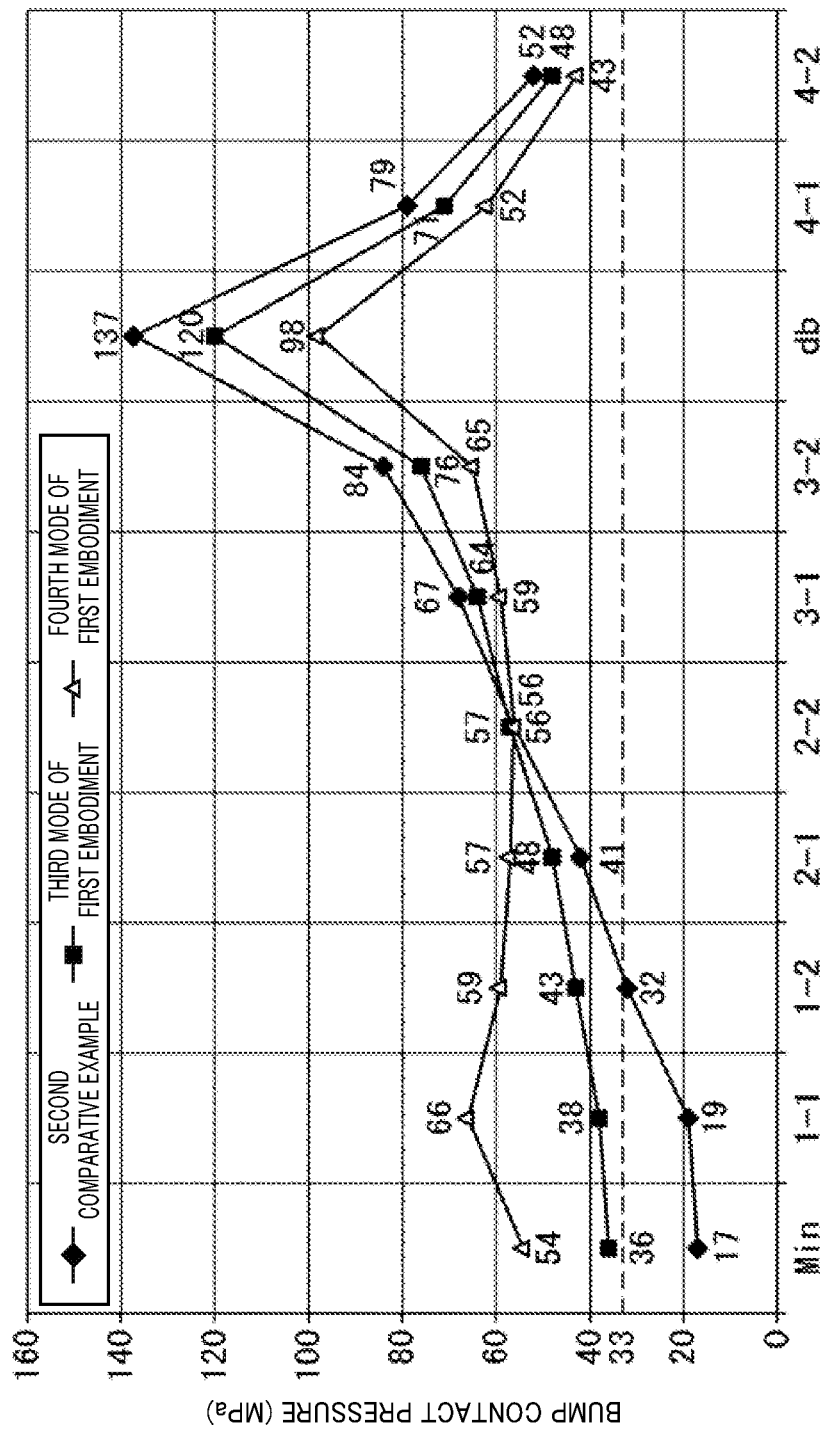
FIG. 24 is a graphic representation showing differences in pressure bonding force between the second comparative example and the third and the fourth modes of the first embodiment.

FIG. 24 graphically summarizes the results of the evaluations in FIGS. 21 to 23. In FIG. 24, the horizontal axis denotes the locations where the pressure bonding force is measured as explained above in reference to FIGS. 21 to 23. Reference character db represents the location of dummy bumps. Reference character Min indicates the location where the pressure bonding force is minimal in the upper subfigure in each of FIGS. 21 to 23. The vertical axis of FIG.

24 stands for the bump contact pressure, i.e., pressure bonding force measured in MPa.

In FIG. 24, the dotted line indicative of 33 MPa is the same as explained above in reference to FIG. 17. With the second comparative example in FIG. 24, the minimum value of the pressure bonding force, i.e., bump contact pressure, is 17 MP and the maximum value is 137 MPa per dummy bump. The presence of dummy bumps in the second comparative example causes the pressure bonding force to be more uniformly distributed than in the first comparative example, but the distribution is not sufficiently uniform. The minimum value of the pressure bonding force is still far below the bump contact pressure of 33 MPa, the rule-of-thumb load required to be applied to each conductive particle.

Meanwhile, with the third mode of the first embodiment, the minimum value of the pressure bonding force, i.e., bump contact pressure, is 36 MPa and the maximum value is 120 MPa. The pressure bonding force is thus distributed in a significantly uniform manner. The minimum value 36 MPa exceeds the bump contact pressure of 33 MPa, which is the rule-of-thumb load required to be applied to each conductive particle.

With the fourth mode of the first embodiment, the minimum value of the bump contact pressure is 54 MPa and the maximum value is 98 MPa. The pressure bonding force is thus distributed far more uniformly. The minimum value of 54 MP appreciably exceeds the bump contact pressure of 33 MPa, the rule-of-thumb load required to be applied to each conductive particle. The reliability of the conductivity with the fourth mode is significantly improved as well.

In this manner, even in the absence of dummy bumps, increasing the width of eaves we appreciably improves the reliability of the connection. The presence of dummy bumps further boosts the connection reliability.

There are diverse elements that raise the minimum pressure bonding force per bump on the driver IC being connected. These elements include the density of conductive particles, hardness of conductive particles, presence of dummy bumps, thickness of the driver IC, thickness of the resin sheet, width of eaves, spacing between input bumps and output bumps, and area ratio of input bumps to output bumps. With these elements taken as parameters, quality engineering may be used to determine which of the elements is more influential than others on the pressure bonding force for bumps.

Figure 26:
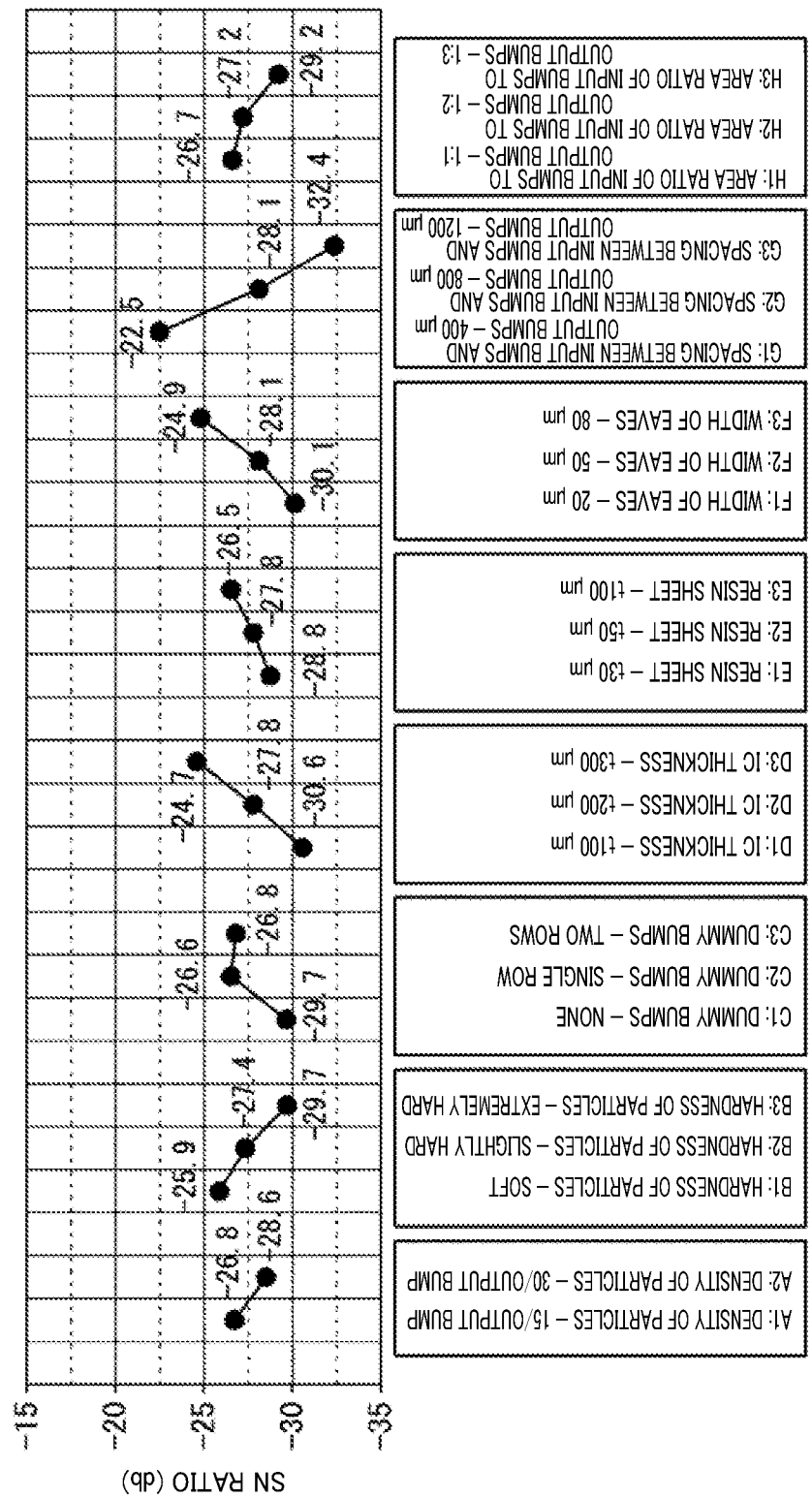
FIG. 26 is a graphic representation showing relations between the control factors and signal-to-noise (SN) ratios.

FIG. 25 is a tabular view listing the above-mentioned elements taken as control factors relative to different levels. In FIG. 25, level 2 is regarded as the standard condition. FIG. 26 is a graphic representation evaluating the degree of influence of each control factor with its parameter varied. In FIG. 26, the horizontal axis denotes the control factors and their parameters, and the vertical axis stands for signal-to-noise (SN) ratios. The SN ratio values are given in decibels (db). The SN ratios in FIG. 26 are all negative. The smaller the absolute value of the SN ratio, the higher the evaluated reliability of the connection.

Where the control factors in FIG. 26 are each varied, the SN ratio involved is changed. The larger the change in the SN ratio, the greater the perceived influence of the corresponding control factor on the reliability of the connection. In FIG. 26, the control factor having the greatest influence on the SN ratio is the spacing between input bumps and output bumps. The control factor having the next greatest influence on the SN ratio is the thickness of the driver IC, followed by the width of eaves.

That is, in improving the pressure bonding force on the bumps, it is significantly effective to shorten the spacing between input bumps and output bumps or to increase the thickness of the driver IC. However, these elements are determined as specified by the customer and are difficult to change arbitrarily. On the other hand, the width of eaves of the driver IC is an important factor that can still be changed freely as long as the driver IC does not stick out from the member on which it is mounted.

Figure 27:
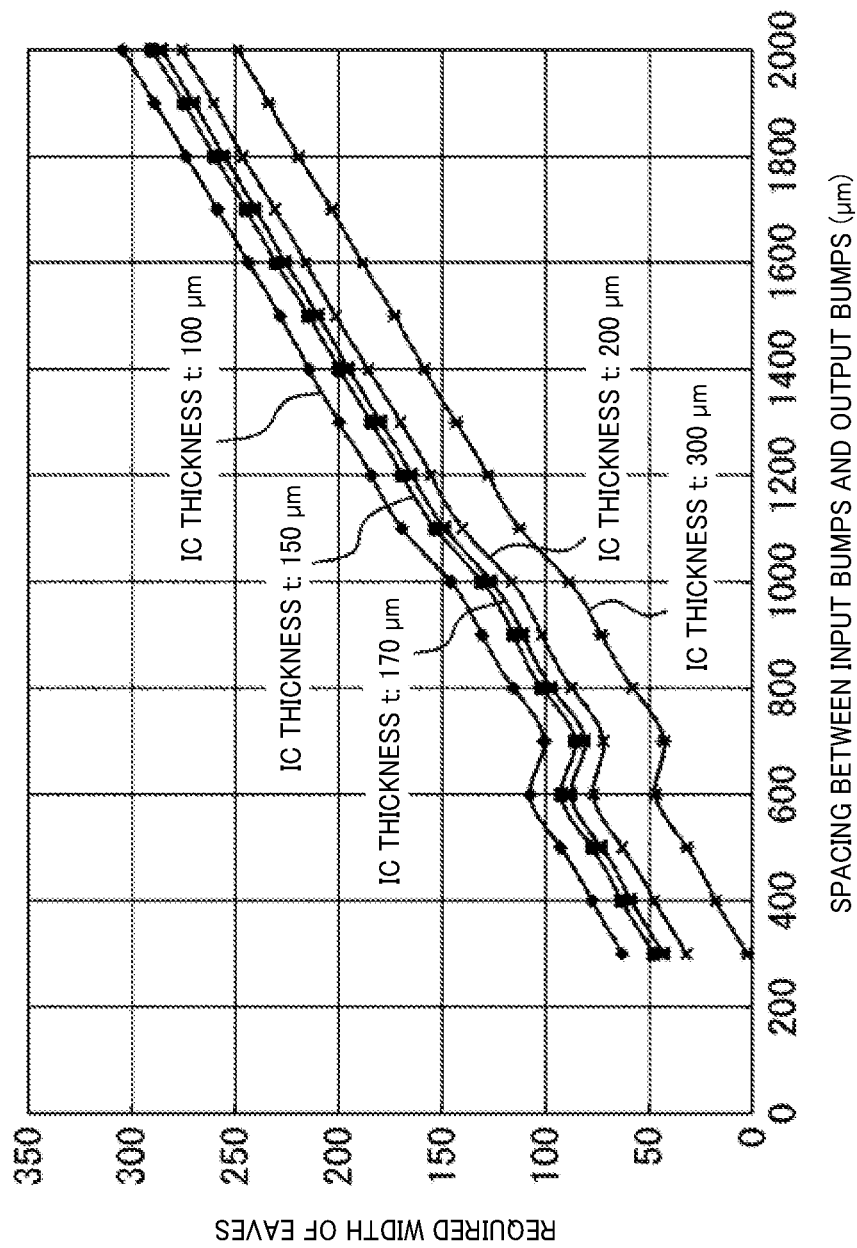
FIG. 27 is a graphic representation showing relations between the spacing between input bumps and output bumps on one hand and the required widths of eaves on the other hand.

Longer spaces between input bumps and output bumps make the pressure bonding force on the outer bumps smaller, as shown in FIG. 26. This leads to problems with the reliability of the connection. The wider the space between input bumps and output bumps, the wider the width of eaves considered needed. FIG. 27 is a graphic representation showing relations between the spacing between input bumps and output bumps on one hand and the corresponding width of eaves on the other hand. The horizontal axis of FIG. 27 represents the spacing between input bumps and output bumps in micrometers, and the vertical axis denotes the required width of eaves also in micrometers. FIG. 27 reveals that the width of eaves of the driver IC needs to be a value larger than those plotted by the curves shown.

The FIG. 27 represents evaluations by simulations made under the condition that there are no dummy bumps if the spacing between input bumps and output bumps is less than 700 μm; that there is one row of dummy bumps if the spacing is 700 μm or longer and less than 1,100 μm; that there are two rows of dummy bumps if the spacing is 1,100 μm or longer and less than 1,400 μm; and that there are three or more rows of dummy bumps if the spacing is 1,400 μm or longer.

As shown in FIG. 27, the larger the thickness of the driver IC, the smaller the required width of its eaves. That is because thicker driver ICs make their bend in the short side direction less pronounced. In FIG. 27, there are inflection points where the spacing between input bumps and output bumps is between 600 μm and 800 μm. These points reveal the differences between two cases, one in which there are no dummy bumps and one in which there are dummy bumps.

Figure 28:
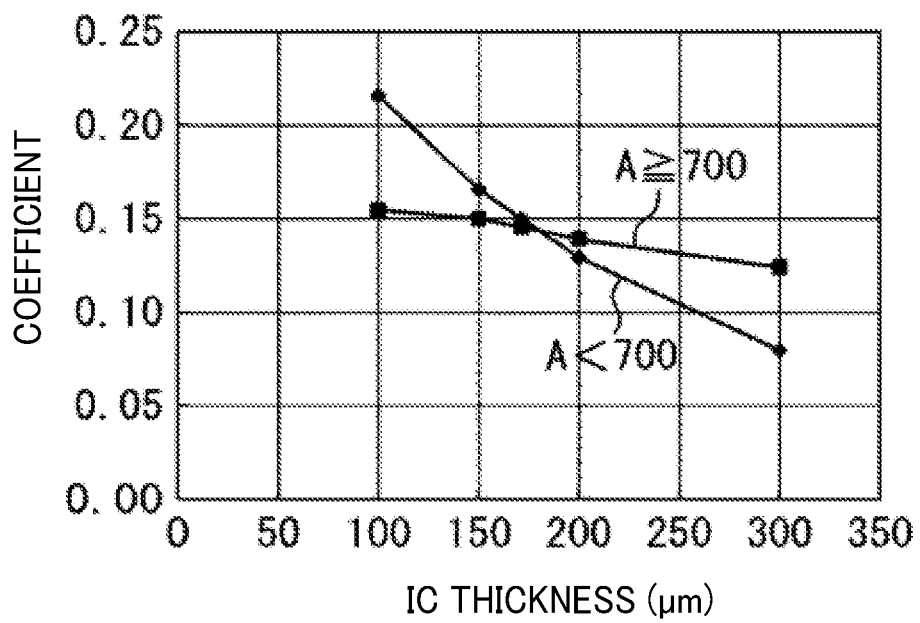
FIG. 28 is a graphic representation showing relations between the spacing between input bumps and output bumps on one hand and the required widths of eaves on the other hand where the thickness of the driver IC is varied.

FIG. 28 is a graphic representation showing relations between the thickness of the driver IC and the required width of eaves. In FIG. 28, two cases are plotted, one in which the spacing A between input bumps and output bumps is less than 700 μm with no dummy bumps, and one in which the spacing A is 700 μm or longer with dummy bumps present. FIG. 28 reveals two things: that the smaller the thickness of the driver IC, the larger the required width of eaves; and that the influence of the thickness of the driver IC is reduced in the presence of dummy bumps.

Table 1 in FIG. 28 lists the coefficients indicative of the relations between the spacing between input bumps and output bumps on one hand and the required width of eaves on the other hand. Table 1 thus tabulates what is depicted in the graph of FIG. 28. The coefficients in Table 1 apply to two cases, one in which the spacing A between input bumps and output bumps is less than 700 μm with no dummy bumps, and one in which the spacing A is 700 μm or longer with dummy bumps present.

As discussed above in reference to FIGS. 11 to 17 and FIGS. 18 to 24, widening the width of eaves of the driver IC is important in improving the minimum pressure bonding force on the bumps. It is also effective to provide dummy bumps. If the width of eaves is not sufficiently appropriated due to layout constraints, providing dummy bumps is effective.

Figure 29:
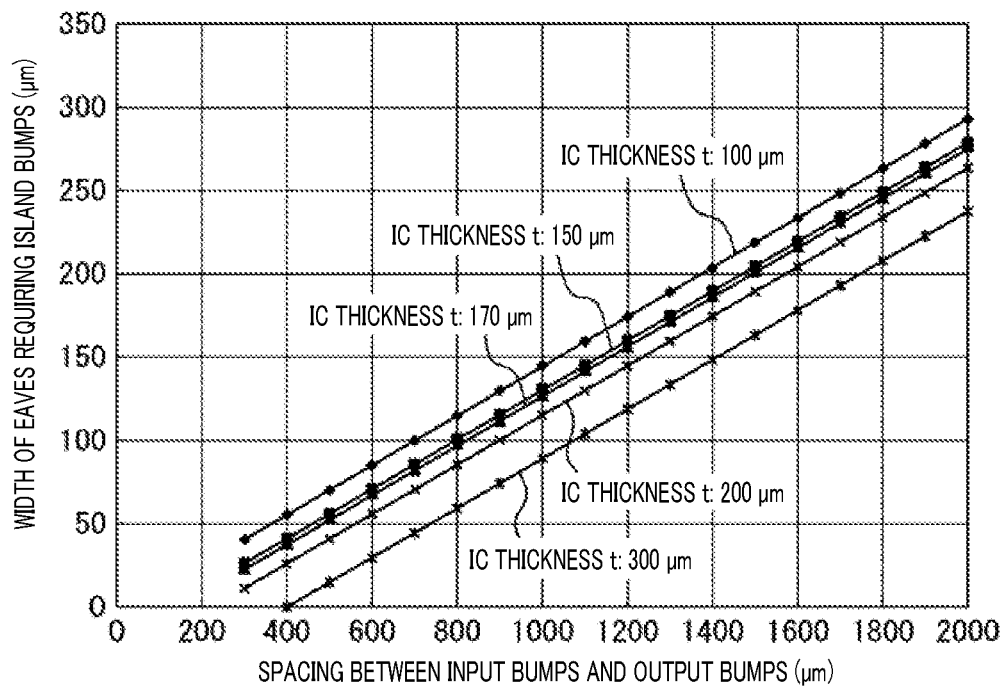
FIG. 29 is a graphic representation showing relations between the spacing between input bumps and output bumps on one hand and the required widths of eaves on the other hand where dummy bumps are needed.

FIG. 29 is a graphic representation showing at what widths of eaves dummy bumps are needed. The horizontal axis of FIG. 29 represents the spacing A between input bumps and output bumps, and the vertical axis denotes the widths of eaves at which dummy bumps become necessary. FIG. 29 plots the relations between the spacing between input bumps and output bumps on one hand and the widths of eaves on the other hand evaluated for different driver IC thicknesses. Where the width of eaves of the driver IC having a given thickness falls below the corresponding curve in FIG. 29, it is preferable to provide dummy bumps.

Table 2 in FIG. 29 lists the relations between the spacing between input bumps and output bumps on one hand and the required widths of eaves on the other hand for each of different driver IC thicknesses. Table 2 thus tabulates what is depicted in the graph of FIG. 29. Where the width of eaves of an actual driver IC falls short of the corresponding width of eaves shown in Table 2, it is preferable to provide dummy bumps. In Table 2, the range of the evaluated spacing between input bumps and output bumps is varied for each of different driver IC thicknesses. This is to take into consideration the conditions of actual driver ICs.

What was discussed above were the evaluations made of the pressure bonding force on the output bump side. However, higher screen resolutions can lead to problems with the pressure bonding force on the input bump side as well. That is, increasing the number of input bumps renders the input bump area narrower and may require disposing multiple rows of input bumps. The above-explained evaluations on the output bump side also apply to the input bump side.

It is to be noted that each input bump has a wider area than each output bump. That means the width of eaves of the driver IC on the input bump side is subject to less rigorous requirements than on the output bump side depending on the number of rows of input bumps involved. The requirements may be determined as follows depending on the input bump row count:

If there are three rows or more of input bumps, the required widths of eaves relative to the spacing between input bumps and output bumps may be the same as those in Table 1 of FIG. 28. In this case, the width of eaves requiring dummy bumps relative to a given space between input bumps and output bumps may be the same as the corresponding width of eaves in Table 2 of FIG. 29.

If there are two rows of input bumps, the required widths of eaves relative to the spacing between input bumps and output bumps may be one half of those calculated in Table 1 of FIG. 28. In this case, the width of eaves requiring dummy bumps relative to a given space between input bumps and output bumps may be one half of the corresponding value calculated in Table 2 of FIG. 29. Because each input bump has a wider area than each output bump, the requirements are less rigorous.

If there is one row of input bumps, the required widths of eaves relative to the spacing between input bumps and output bumps may be one-third of those calculated in Table 1 of FIG. 28. In this case, the width of eaves requiring dummy bumps relative to a given space between input bumps and output bumps may be one-third of the corresponding value calculated in Table 2 of FIG. 29. Because each input bump has a wider area than each output bump, the requirements are less rigorous.

Figure 30:
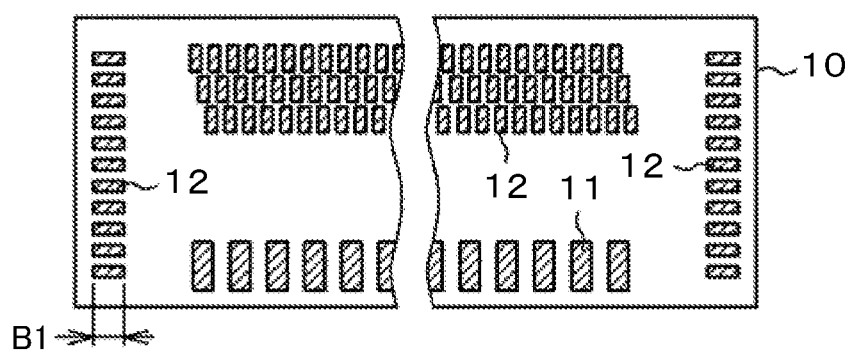
FIG. 30 is a plan view showing output bumps being also formed on the short sides of the driver IC.
Figure 31:
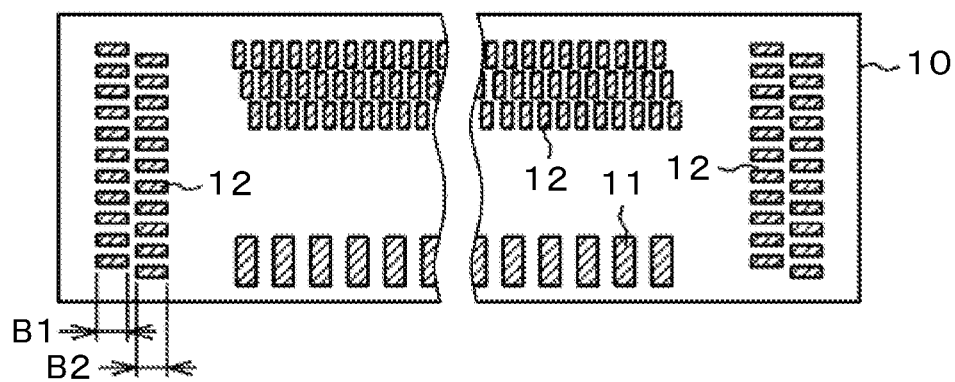
FIG. 31 is a plan view showing output bumps being formed in two rows on the short sides of the driver IC.
Figure 32:
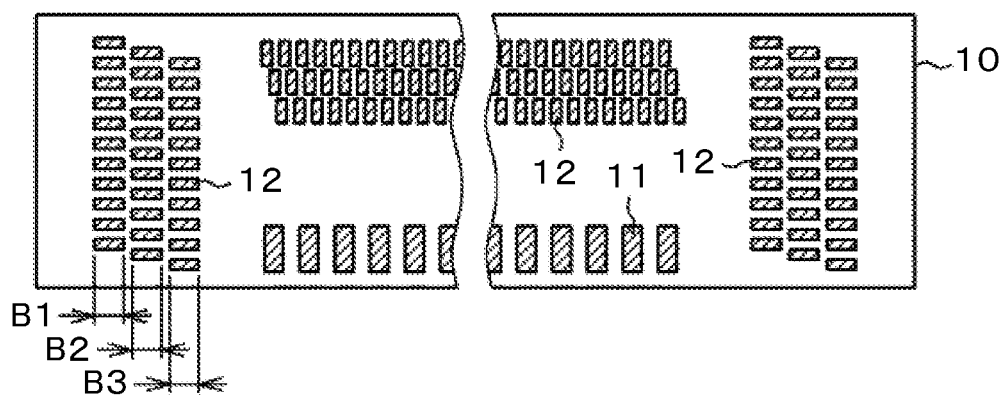
FIG. 32 is a plan view showing output bumps being formed in three rows on the short sides of the driver IC.

FIGS. 30 to 32 are plan views of driver ICs where output bumps are disposed on the short sides as well. Even where the bumps are arranged on the short sides, controlling the width of eaves is effective for ensuring stable pressure bonding force on the bumps.

FIG. 30 shows an example in which one row of output bumps is arrayed on each short side of the driver IC. In this configuration, the width of eaves on the short sides is made at least as wide as the long side dimension B1 of the output bumps on each short side. This ensures stable pressure bonding force on the output bumps on the short sides.

FIG. 31 shows an example in which two rows of output bumps are arrayed on each short side of the driver IC. In this configuration, the width of eaves on the short sides is made at least one half of the size obtained by adding up the long side dimensions (B1 and B2) of the output bumps in two rows on each short side (size: B1+B2). This ensures stable pressure bonding force on the output bumps on the short sides.

FIG. 32 shows an example in which three rows of output bumps are arrayed on each short side of the driver IC. In this configuration, the width of eaves on the short sides is made at least one half of the size obtained by adding up the long side dimensions (B1, B2 and B3) of the output bumps in three rows on each short side (size: B1+B2+B3). This ensures stable pressure bonding force on the output bumps on the short sides.

Second Embodiment

A second embodiment of the present invention is configured to be more effective in ensuring the pressure bonding force using dummy bumps.

Figure 33:
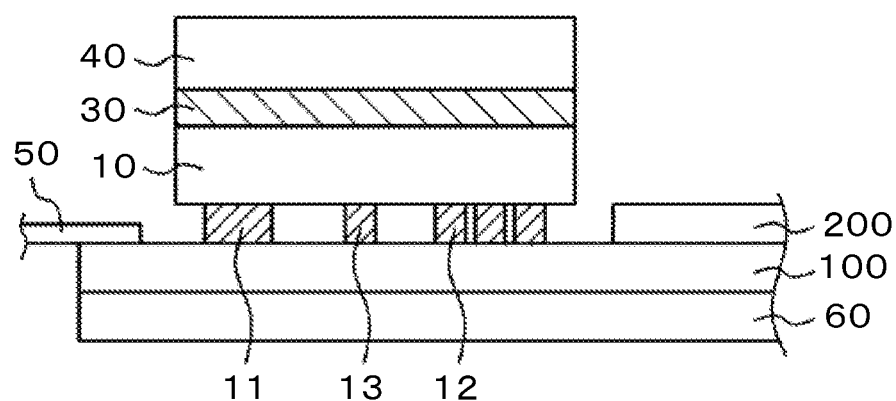
FIG. 33 is a cross-sectional view showing how a driver IC having dummy bumps is connected to a TFT substrate.

FIG. 33 is a cross-sectional view showing how the driver IC 10 having ordinary dummy bumps 13 is connected to the TFT substrate 100. In FIG. 33, the input bumps 11 are disposed on the left side of the driver IC 10, the output bumps 12 are disposed in three rows on the right side, and dummy bumps 13 are disposed between the input bumps 11 and the output bumps 12. The driver IC 10 is pressure-bonded by the pressure bonding head 40 to the TFT substrate 100 with the resin sheet 30 interposed therebetween. The ACF is not shown in FIG. 33. The ACF is also not shown in FIGS. 34 to 36. In FIG. 33, the TFT substrate 100 is placed on the bearer 60. In FIG. 33, the input bumps 11, output bumps 12, and dummy bumps 13 have the same height.

FIG. 34 is a cross-sectional view showing a first mode of the second embodiment. The left subfigure in FIG. 34 shows how the driver IC 10 of the first mode of the second embodiment is pressure-bonded to the TFT substrate 100. The right subfigure is a plan view of the driver IC 10 of the first mode of the second embodiment. The dummy bumps 13 on the driver IC 10 are disposed at intervals. The dummy bumps 13 between the input bumps 11 and the output bumps 12 are taller than the other bumps on both sides. The presence of the dummy bumps 13 effectively eases the stress forcing the driver IC 10 to bend in convex fashion toward the substrate 100. This makes it possible to secure the pressure bonding force necessary for the output bumps 12 or the input bumps 11 on the outermost periphery.

FIG. 35 is a cross-sectional view showing a second mode of the second embodiment. The left subfigure in FIG. 35 is a cross-sectional view showing how the driver IC 10 of the second mode is pressure-bonded to the TFT substrate 100. The right subfigure is a plan view of the driver IC 10 of the second mode of the second embodiment. What characterizes this mode is that a continuous, rod-like dummy bump 13 is disposed on the driver IC 10. Formed in a continuous rod-like shape, the dummy bump 13 gives more repulsive power to effectively ease the stress causing the driver IC 10 to bend in convex fashion toward the substrate 100. This provides the pressure bonding force necessary for the output bumps 12 or the input bumps 11 on the outermost periphery.

FIG. 36 is a cross-sectional view showing a third mode of the second embodiment. The left subfigure in FIG. 36 is a cross-sectional view showing how the driver IC 10 of the third mode is pressure-bonded to the TFT substrate 100. The right subfigure is a plan view of the driver IC 10 of the third mode of the second embodiment. The dummy bumps 13 of the driver IC 10 are disposed at intervals. The driver IC 10 is the same as that in FIG. 33.

What characterizes the configuration in FIG. 36 is that a protrusion 170 is disposed on the TFT substrate 100 in a manner corresponding to the dummy bumps 13 of the driver IC 10. This configuration provides the same effect as that explained above in reference to FIG. 34. The protrusion 170 on the TFT substrate 100 is formed by leaving intact a portion of an organic passivation film in the display area, for example. Because the organic passivation film is formed as thick as 3.5 µm, a suitable portion of the film serves well as the protrusion. If the protrusion from the organic passivation film is too tall, the film may be half-exposed to adjust the height. Using the organic passivation film allows the protrusion to be formed in the same process in which the organic passivation film is processed within the display area. That means no further process load is incurred.

The second embodiment is configured in such a manner that on the location where the dummy bumps 13 are formed, the gap between the TFT substrate 100 and the driver IC 10 is the largest. In this case, the driver IC 10 is formed to be inversely convex against the TFT substrate 100. This further boosts the pressure bonding force on the bumps along the outermost periphery.

As described above, the second embodiment eases the stress forcing the driver IC 10 to bend in convex fashion toward the TFT substrate 100. Alternatively, the second embodiment causes the driver IC 10 to bend in an inversely convex manner against the TFT substrate 100. This ensures stable pressure bonding force on the bumps along the periphery of the driver IC 10.

Third Embodiment

A third embodiment of the present invention is configured to control the height of the terminals on the TFT substrate in a manner easing the stress causing the driver IC to bend toward the TFT substrate. FIG. 37 is a cross-sectional view showing the process in which the driver IC 10 having ordinary dummy bumps 13 is pressure-bonded to an ordinary TFT substrate 100. The configuration in FIG. 37 is the same as that in FIG. 33 except that the terminals 160 on the TFT substrate 100 are shown. The height of the terminals 160 on the TFT substrate 100 is the same as in FIG. 33.

FIG. 38 is a cross-sectional view showing how the driver IC 10 and TFT substrate 100 of the third embodiment are connected to each other. What characterizes the configuration in FIG. 38 is that the height of the terminals is varied for each of the rows of bumps. In FIG. 38, the height of the terminals corresponding to the dummy bumps 13 is the same as that of the terminals corresponding to the inner row of the output bumps 12. First terminals 161 corresponding to the middle row of the output bumps 12 are taller than the terminals corresponding to the inner row of the output bumps 12. The terminals 161 corresponding to the middle row of the output bumps 12 are as tall as the terminals 161 corresponding to the row of the input bumps 11.

In FIG. 38, protruding second terminals 162 corresponding to the outermost row of the output bumps 12 are taller than the other protruding terminals. This structure increases the pressure bonding force on the outermost row of the output bumps 12 and ensures stable conductivity thereof. The second protruding terminals 162 are made taller than the ordinary protruding terminals 160 by about 3 to 5 µm, approximately the same as the diameter of a conductive particle on the bumps. The first protruding terminals 161 are made taller than the ordinary protruding terminals 160 by 1.5 to 2.5 µm, approximately half as tall as the diameter of a conductive particle on the bumps.

FIG. 39 is a schematic view showing a typical structure of the means for controlling the height of the terminals in FIG. 38, using the second terminals 162 as an example. The upper subfigure in FIG. 39 is a plan view of one such terminal. Each terminal is covered by indium tin oxide (ITO) constituting a transparent conductive film. The ITO is connected to a terminal metal via contact holes 165.

The lower subfigure in FIG. 39 is a cross-sectional view taken on line T-T in the upper subfigure. In the lower subfigure, an organic passivation film 111 is formed over a terminal metal 110 connected to leader lines extended from the display area. The contact holes are formed in the organic passivation film 111. An inorganic passivation film 112 is formed to cover the organic passivation film 111. The ITO 113 is formed to cover the inorganic passivation film 112 and the contact holes. The bumps of the driver IC are connected to the ITO 113 in FIG. 39.

The organic passivation film 111 is approximately 3.5 µm thick and is fit to serve as the protruding second terminals 162. Whereas the first terminals 161 are about half as tall as the second terminals 162, the low-height terminals may be formed by half-exposing the organic passivation film 111. The protruding terminals are formed in the same process in which the organic passivation film is processed in the display area. That means no further process load is incurred.

Figure 40:
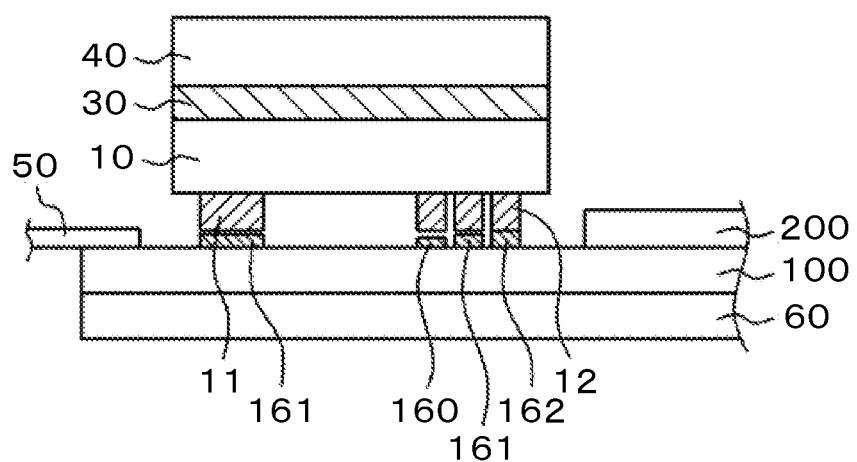
FIG. 40 is a cross-sectional view showing another mode of the third embodiment.

FIG. 40 is a cross-sectional view showing another mode of the third embodiment in which there are no dummy bumps. In FIG. 40, three rows of the output bumps 12 and one row of the input bumps 11 are formed. Of the terminals on the TFT substrate 100 corresponding to the output bumps 12, those in the outermost row 162 are the tallest, followed by those in the middle row 161 and those in the inner row 160 in order of height. The terminals corresponding to the input bumps 11 have the same height as the terminals corresponding to the middle row of the output bumps 12. Where at least three rows of the output bumps are formed, the middle row may be defined to be the second row from the innermost row.

As described above, the third embodiment is configured to make the terminals progressively taller toward the outer periphery in the short side direction. This ensures stable pressure bonding force on the outermost row of bumps, thereby ensuring the reliability of the connection of the driver IC.

The first to the third embodiments above were discussed on the basis of liquid crystal display devices. Alternatively, the present invention may be applied to other types of display devices including organic EL display devices.

What is claimed is:

1. A display device comprising;
    a substrate includes a plurality of first terminals and a plurality of second terminals; and
    a driver IC, mounted on the substrate, includes a first long side having a first edge, a second long side opposite to the first long side and having a second edge, a plurality of first bumps being formed along the first long side and connected to the first terminals, and a plurality of second bumps being formed along the second long side and connected to the second terminals;

wherein the driver IC has a first area between the first bumps and the second bumps and a second area between the second bumps and the second edge, wherein, in a cross section in a direction perpendicular to the first long side and the second long side, the first area and the second area being bent toward the substrate.

2. The display device according to claim 1, wherein the second bumps are formed in a plurality of rows in parallel with the second long side.

3. The display device according to claim 1, wherein the driver IC has a plurality of dummy bumps formed between the first bumps and the second bumps.

4. The display device according to claim 1, wherein the second bumps are formed in at least three rows in parallel with the second long side; and wherein the second terminals are formed to be progressively taller in relation to the inner row, the middle row, and the outer row of the second bumps, in that order.

5. The display device according to claim 4, wherein the second terminals corresponding to the second bumps in the middle row have the same height as the first terminals.

6. The display device according to claim 4, wherein the driver IC includes a plurality of dummy bumps between the first bumps and the second bumps; and wherein the height of the terminals corresponding to the dummy bumps being less than that of the second terminals corresponding to the second bumps in the outermost row.

7. The display device according to claim 4, wherein the driver IC includes a plurality of dummy bumps between the first bumps and the second bumps; and wherein the height of the terminals corresponding to the dummy bumps being less than that of the second terminals corresponding to the second bumps in the middle row.

8. A display device comprising;

a substrate includes a plurality of first terminals and a plurality of second terminals; and a driver IC, mounted on the substrate, include a first long side having a first edge, a second long side opposite to the first long side and having a second edge, a plurality of first bumps being formed along the first long side and connected to the first terminals, and a plurality of second bumps being formed along the second long side and connected to the second terminals;

wherein the driver IC has a first area between the first bumps and the second bumps, a second area between the second bumps and the second edge, and a third area corresponding to a location where the second bumps are formed, wherein, in a cross section in a direction perpendicular to the first long side and the second long side, a maximum gap between the substrate and the driver IC in the third area is greater than a maximum gap between the substrate and the second edge of the driver IC in the second area.

9. The display device according to claim 8, wherein the second bumps are formed in a plurality of rows in parallel with the second long side.

10. The display device according to claim 8, wherein the driver IC has a plurality of dummy bumps formed between the first bumps and the second bumps.

11. A display device comprising;

a substrate includes a plurality of first terminals, a plurality of second terminals, and a plurality of dummy terminals; and a driver IC, mounted on the substrate, includes a first long side having a first edge, a second long side opposite to the first long side and having a second edge, a plurality of first bumps being formed along the first long side and connected to the first terminals, a plurality of second bumps being formed along the second long side and connected to the second terminals, and a plurality of dummy bumps being formed between the first bumps and the second bumps and connected to the dummy terminals;

wherein, in a cross section in a direction perpendicular to the first long side and the second long side, the first edge and the second edge are bent toward the substrate from the dummy bumps.

12. The display device according to claim 11, wherein the dummy bumps are taller than the first bumps and the second bumps.

13. The display device according to claim 11, wherein the dummy bumps are formed in parallel with the first long side.

14. The display device according to claim 11, wherein the dummy terminals are taller than the first terminals and the second terminals.

* * * * *